United States Patent
Abe et al.

(10) Patent No.: US 8,820,232 B2
(45) Date of Patent: Sep. 2, 2014

(54) SCREEN PRINTING DEVICE AND SCREEN PRINTING METHOD

(75) Inventors: Seikou Abe, Osaka (JP); Takashi Yazawa, Yamanashi (JP)

(73) Assignee: Panasonic Corporation, Osaka (JP)

( * ) Notice: Subject to any disclaimer, the term of this patent is extended or adjusted under 35 U.S.C. 154(b) by 40 days.

(21) Appl. No.: 13/823,825

(22) PCT Filed: Oct. 17, 2011

(86) PCT No.: PCT/JP2011/005799
§ 371 (c)(1),
(2), (4) Date: Mar. 15, 2013

(87) PCT Pub. No.: WO2012/053183
PCT Pub. Date: Apr. 26, 2012

(65) Prior Publication Data
US 2013/0169979 A1    Jul. 4, 2013

(30) Foreign Application Priority Data

Oct. 19, 2010    (JP) ................. 2010-234324

(51) Int. Cl.
| | |
|---|---|
| *B41F 15/08* | (2006.01) |
| *B41F 15/26* | (2006.01) |
| *B41M 1/12* | (2006.01) |
| *H05K 3/12* | (2006.01) |
| *G06K 15/02* | (2006.01) |
| *H05K 1/02* | (2006.01) |

(52) U.S. Cl.
CPC ............. *G06K 15/02* (2013.01); *H05K 3/1216* (2013.01); *H05K 1/0269* (2013.01); *H05K 2203/166* (2013.01); *H05K 2201/09918* (2013.01); *B41F 15/26* (2013.01); *B41M 1/12* (2013.01)
USPC ............................ 101/126; 101/129; 101/481

(58) Field of Classification Search
CPC .......... B41F 15/26; B41M 1/12; G06K 15/02; H05K 3/1216; H05K 1/0269; H05K 2201/09918; H05K 2203/166
USPC .............. 101/114, 123, 126, 127.1, 129, 481, 101/485, 486
See application file for complete search history.

(56) References Cited

U.S. PATENT DOCUMENTS

2009/0199729 A1    8/2009   Aiba

FOREIGN PATENT DOCUMENTS

| JP | 2007-038456 A | 2/2007 |
|---|---|---|
| JP | 4364333 B2 | 8/2009 |
| WO | 2008/007744 A1 | 1/2008 |

OTHER PUBLICATIONS

International Search Report for PCT/JP2011/005799 dated Nov. 15, 2011.

*Primary Examiner* — Leslie J Evanisko
(74) *Attorney, Agent, or Firm* — Pearne & Gordon LLP

(57) ABSTRACT

Prior to a mark imaging process executed for the purpose of detecting a position of recognition marks for positioning the substrate and the mask, an optical axis calibration processing process of detecting a horizontal relative position between imaging optical axes, and a surface correction data creation processing process of detecting a local positional deviation of the imaging optical axes, which is caused by the travel of the imaging unit, are executed. Before starting production, a production pre-start precision evaluation process for evaluating a substrate positioning precision is executed by using a verification substrate and a verification mask, and after starting the production, a production post-start precision evaluation process for evaluating a substrate positioning precision after starting the production is executed by using a commercial production substrate and a commercial production mask.

4 Claims, 15 Drawing Sheets

FIG.5(a)
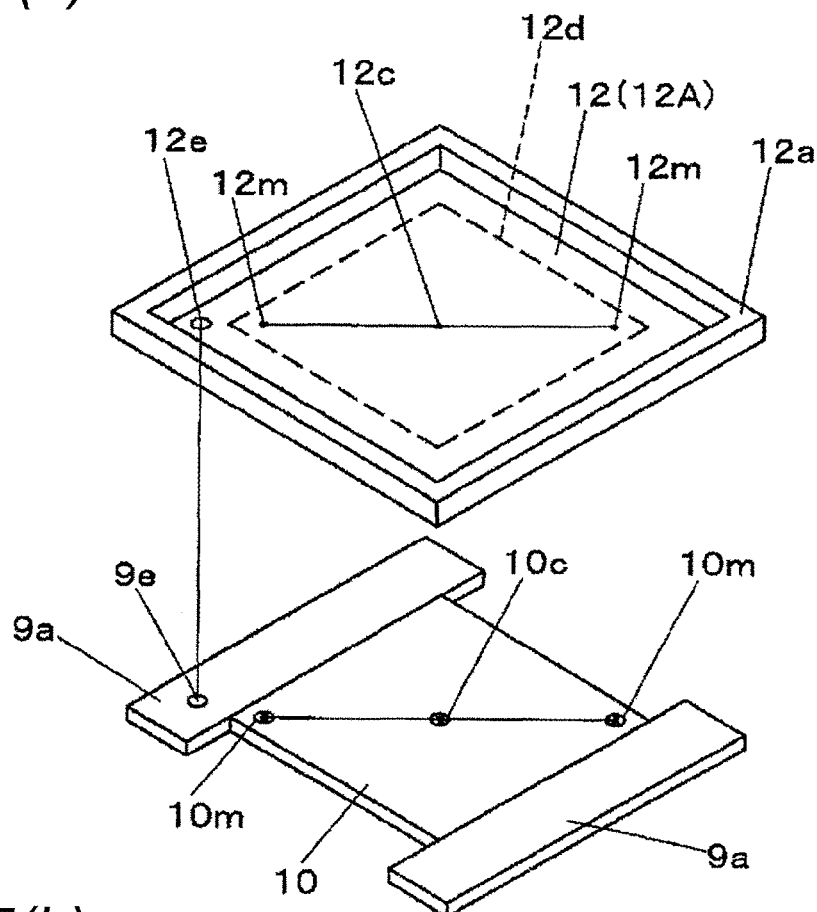
FIG.5(b)
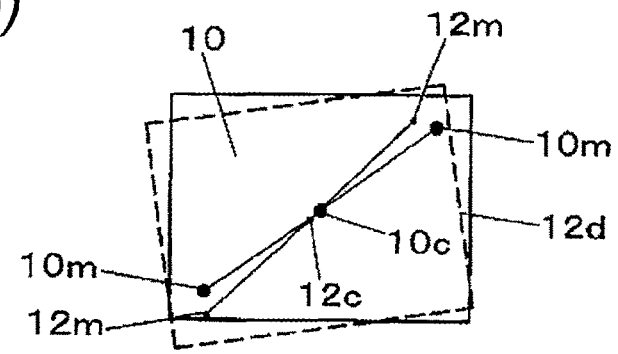
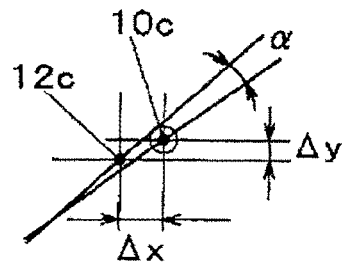

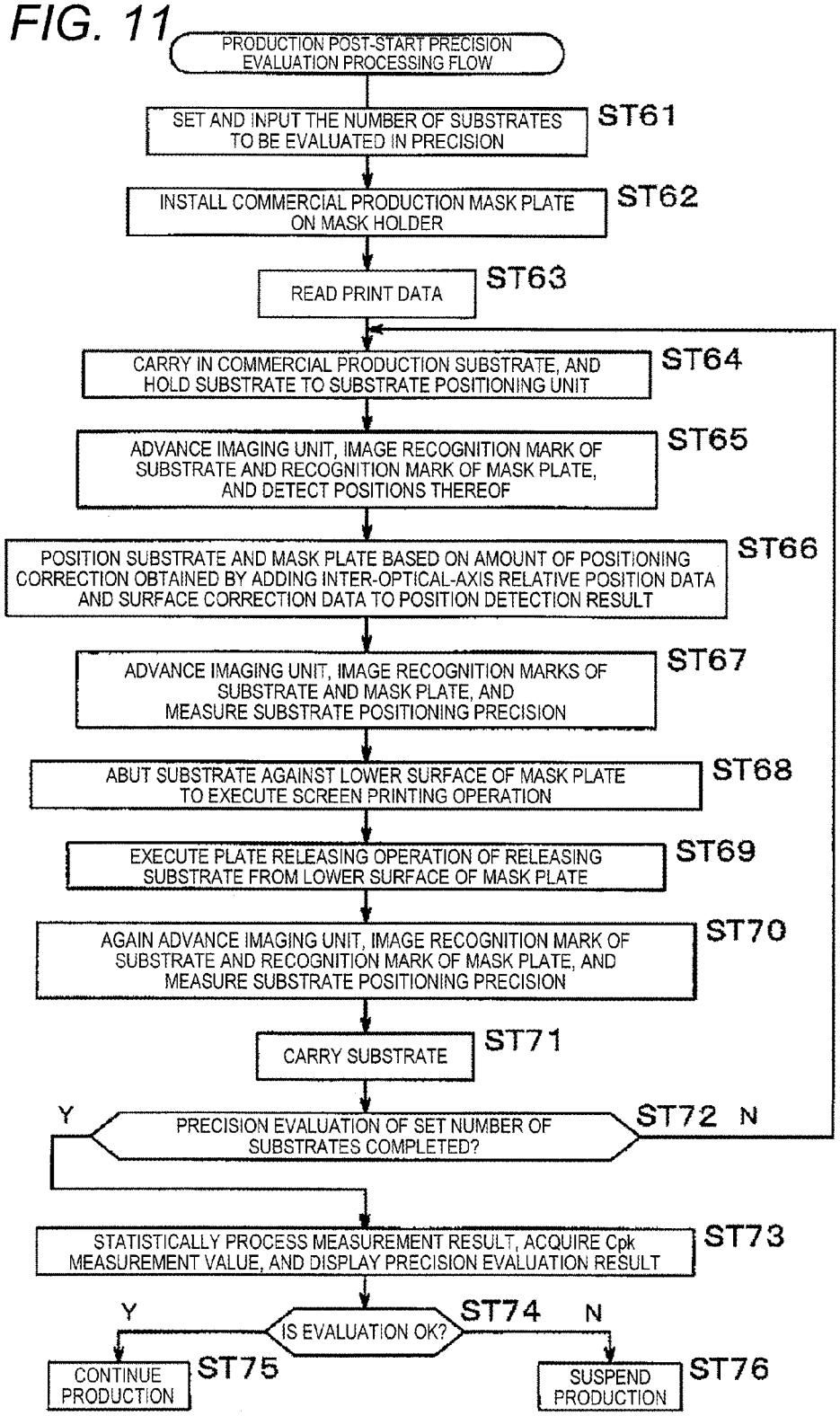

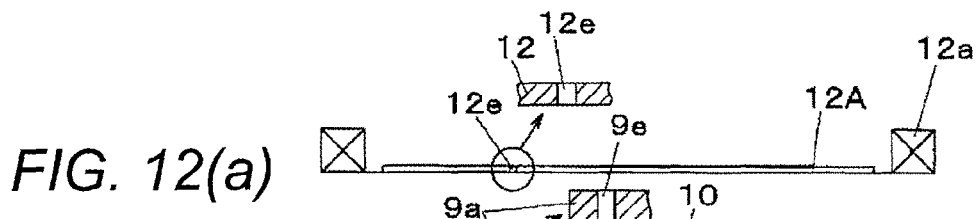
FIG. 12(a)
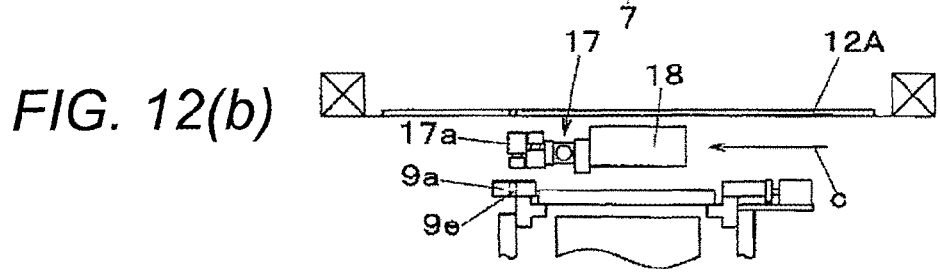
FIG. 12(b)
FIG. 12(c)
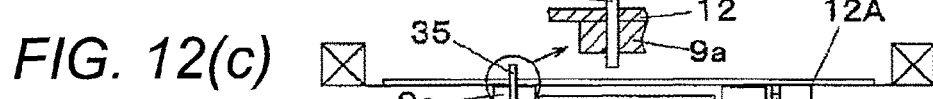
FIG. 12(d)
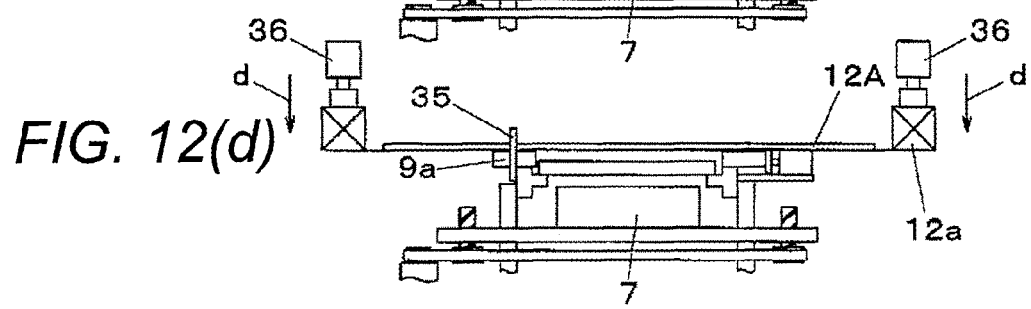
FIG. 12(e)
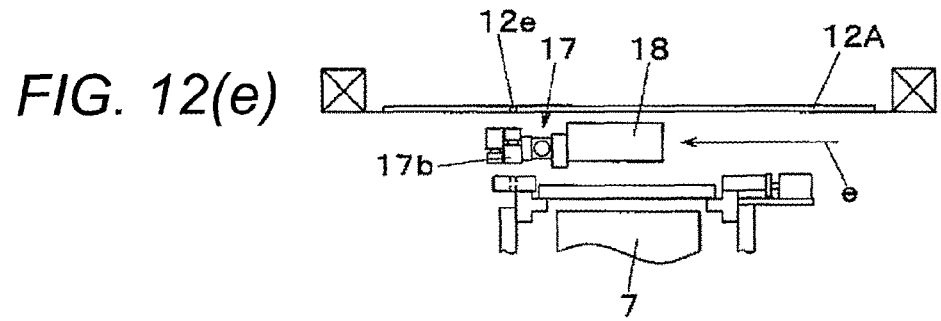

SCREEN PRINTING DEVICE AND SCREEN PRINTING METHOD

TECHNICAL FIELD

The present invention relates to a screen printing device and a screen printing method for printing a paste such as a solder cream on a substrate.

BACKGROUND ART

As a method for supplying a component joint paste such as a solder cream onto a substrate in a component mount line where an electronic component is mounted on the substrate, screen printing is used. In the screen printing, the substrate is abutted against a mask plate in which pattern holes are formed in correspondence with a print portion of the paste, and the paste is supplied onto the mask plate to conduct squeegeeing operation of sliding a squeegee, to print the paste on the substrate through the pattern holes. In order to properly print the paste in the screen printing, there is a need to properly position the substrate with respect to the mask plate.

The substrate positioning is generally conducted by imaging recognition marks each provided on the substrate and the mask plate by a camera to conduct positional recognition. In this situation, because a coordinate system when imaging the substrate and a coordinate system when imaging the mask plate are different in position reference from each other, there is a need to obtain position reference data for specifying a positional relationship between those coordinate systems. For that reason, up to now, a screen printing device has been known which include a calibration processing function of imaging the substrate and the mask plate to obtain the position reference data between the coordinate systems (for example, refer to Patent Document 1). The related art in the Patent Document describes an example in which, in a configuration where the mask plate and the substrate are imaged by a single imaging unit, a positional deviation between a coordinate system of a substrate positioning unit and a coordinate system of a moving unit for moving the imaging unit is obtained on the basis of image data acquired by the imaging unit.

RELATED ART DOCUMENTS

Patent Documents

Patent Document 1: JP-B-4364333

SUMMARY OF THE INVENTION

Problem to be Solved by the Invention

Incidentally, as a configuration of an imaging unit that images the above-described substrate and mask plate for positional recognition, there is used a configuration having two imaging optical axes of an upward imaging optical axis having a lower surface of the mask plate as an imaging image, and a downward imaging optical axis having an upper surface of the substrate as the imaging image. This configuration has such an advantage that the imaging unit is moved by a single travel unit to enable both of the substrate and the mask plate to be imaged. However, in conducting the positional recognition of the substrate and the mask plate by the imaging unit thus configured, the above-described configuration causes disadvantages described below in a case where the position recognition is intended for a substrate requiring a high printing position precision.

First, in a configuration having two imaging optical axes for imaging objects in an upper direction and a lower direction, some deviation unavoidably occurs in a directional position of an imaging optical axis due to an error in processing of installing an optical system configuring the imaging unit. For that reason, in an imaging operation for moving the imaging unit to image the objects in the two upper and lower directions, when the imaging surface of the upper mask plate and the imaging surface of the lower substrate are to be imaged, an error occurs in a horizontal direction of the two imaging optical axes, resulting in a case where a correct position recognition result is not obtained. Further, ball screws used for a moving mechanism for horizontally moving the imaging unit with respect to the substrate and the mask plate have a local position error, and a positional deviation specific to a target position to be moved is present between a command position indicated by a control command and a moved position to which the imaging unit is really moved.

For that reason, when plural types of substrates different in shape and size are to be worked by an identical device, an error occurs in a position recognition result according to a position of the substrate at which the recognition mark is formed. Also, since the recognition mark on the mask plate corresponds to the position of the recognition mark on the substrate, the same error occurs in the positional recognition result. When the substrate and the mask plate are positioned with the above errors of the positional recognition results, the pattern holes do not precisely match the print portion of the substrate, resulting in a printing trouble such as a printing positional deviation.

Further, complicated operation and processing such as adjustment of a machine parameter are required in calibration processing for confirming a precision in the positioning of the substrate and the mask plate. Therefore, up to now, the confirmation of the substrate positioning precision is usually conducted only at the time of conducting a shipping inspection in a device manufacturer. For this reason, even when the user needs to confirm whether the substrate positioning precision is high, or not, according to a requirement of printing quality management at the time of inspection before starting production, or in production continuation processing for executing printing on a plurality of substrates, it is difficult to confirm the substrate positioning precision in a simple method, and an appropriate countermeasure is desired.

Under the circumstances, in order to attend to various problems with the above-described related art, an object of the present invention is to provide a screen printing device and a screen printing method, which can easily confirm whether the substrate positioning precision is high, or not, at the time of inspection before starting the production or during the production continuation processing, in a configuration where the imaging unit having two imaging optical axes and intended to image the substrate and the mask plate is horizontally moved.

Means for Solving the Problem

The present invention provides a screen printing device that abuts a substrate against a mask plate in which pattern holes are formed to print a paste, the screen printing device comprising: a substrate positioning unit that holds a substrate carried from an upstream side, and moves the substrate relatively in a horizontal direction and a vertical direction to position the substrate at a given position; a screen print unit that allows a squeegee to slide on the mask plate onto which the paste is supplied, to print the paste on the substrate through the pattern holes; an imaging unit that has two imaging optical axes of which imaging directions are upward and downward, respectively, and conducts mark imaging operation of imaging a substrate recognition mark and a mask recognition mark formed on the substrate and the mask plate, respectively; an imaging unit moving mechanism that moves the imaging unit in the horizontal direction with respect to the substrate and the mask plate; a recognition processing unit that subjects an imaging result in the mark imaging operation to recognition processing, thereby conducting mark recognition processing for detecting positions of the substrate recognition mark and the mask recognition mark; an optical axis calibration processing unit that detects relative positions of the imaging optical axes on a mask lower surface and a substrate upper surface which are imaging surfaces of the two imaging optical axes, respectively, by imaging two reference marks associated with the relative positions by the imaging unit, individually, and outputs the detected relative positions as inter-optical-axis relative position data; a surface correction data creation processing unit that obtains a position error of the imaging optical axis occurring on the imaging surfaces in the horizontal direction caused by the move of the imaging unit by the imaging unit moving mechanism, as a positional deviation in the horizontal direction which is specific to each of reference points set in an ordered array for a substrate area on which the substrate is held and a mask area on which a mask plate is installed, respectively, and outputs the obtained position error as surface correction data representing a local positional deviation state in each of surfaces of the substrate area and the mask area; a substrate positioning control unit that controls the imaging unit, the imaging unit moving mechanism, and the recognition processing unit so as to execute the mark imaging operation and the mark recognition processing, and controls the substrate positioning unit on the basis of the inter-optical-axis relative position data, the surface correction data, and the result of the mark recognition processing to execute substrate positioning operation for positioning the substrate and the mask plate; and a precision evaluation unit that evaluates a positioning precision of the substrate positioning operation, wherein before starting production by the screen printing device, the precision evaluation unit corrects the moving operation of the imaging unit by the imaging unit moving mechanism on the basis of the inter-optical-axis relative position data and the surface correction data for a verification substrate and a verification mask each having a reference point set in an ordered array, which are produced in advance for verifying a positioning precision of the substrate and the mask plate to execute the mark imaging operation, the mark recognition processing, and the substrate positioning operation, wherein after the substrate positioning operation, the precision evaluation unit corrects the moving operation of the imaging unit by the imaging unit moving mechanism on the basis of the inter-optical-axis relative position data and the surface correction data to again execute the mark imaging operation and the mark recognition processing, and evaluates the positioning precision in a state before starting the production on the basis of the recognition result in the mark recognition processing, wherein after starting the production by the screen printing device, the precision evaluation unit further corrects the moving operation of the imaging unit by the imaging unit moving mechanism on the basis of the inter-optical-axis relative position data and the surface correction data for a commercial production substrate and a commercial production mask to execute the mark imaging operation, the mark recognition processing, and the substrate positioning operation, and wherein after the substrate positioning operation, the precision evaluation unit corrects the moving operation of the imaging unit by the imaging unit moving mechanism on the basis of the inter-optical-axis relative position data and the surface correction data to again execute the mark imaging operation and the mark recognition processing, and evaluates the positioning precision in a state after starting the production on the basis of the recognition result in the mark recognition processing.

The present invention also provides a screen printing method in which a substrate is abutted against a mask plate having pattern holes formed therein to print a paste, the screen printing method comprising: a substrate holding step of holding a substrate carried from an upstream side by a substrate positioning unit; a mark imaging step of imaging a substrate recognition mark formed on the substrate, and a mask recognition mark formed on the mask plate installed in a screen printing unit by an imaging unit that has two imaging optical axes of which imaging directions are upward and downward, respectively, and is moved in a horizontal direction with respect to the substrate and the mask plate by the imaging unit moving mechanism; a mark recognition processing step of recognizing an imaging result in the mark imaging step by a recognition processing unit, thereby detecting positions of the substrate recognition mark and the mask recognition mark; a substrate positioning step of positioning the substrate to the mask plate by controlling the substrate positioning unit on the basis of the position detection results of the substrate recognition mark and the mask recognition mark; and a screen printing step of printing a paste on the substrate through the pattern holes by sliding a squeegee on the mask plate having the pattern holes to which the paste is supplied, wherein, prior to the mark imaging step, there are executed: an optical axis calibration processing step of detecting horizontal relative positions of the respective imaging optical axes on a mask lower surface and a substrate upper surface which are imaging surfaces of the two imaging optical axes, respectively, by imaging two reference marks associated with the relative positions, individually, and outputting the detected relative positions as inter-optical-axis relative position data; and a surface correction data creation processing step of obtaining a position error of the imaging optical axis occurring on the imaging surface in the horizontal direction caused by the move of the imaging unit by the imaging unit moving mechanism, as a positional deviation in the horizontal direction for each of reference points set in an ordered array for a substrate area on which the substrate is held and a mask area on which a mask plate is installed, respectively, and outputting the obtained position error as surface correction data representing a local positional deviation state in each of surfaces of the substrate area and the mask area, wherein in a production pre-start precision evaluation step executed to evaluate a positioning precision in the substrate positioning operation before starting the production, the moving operation of the imaging unit by the imaging unit moving mechanism is corrected on the basis of the inter-optical-axis relative position data and the surface correction data for a verification substrate and a verification mask each having a reference point set in an ordered array, which are produced in advance for verifying a positioning precision of the substrate and the mask plate to execute the mark imaging operation, the mark recognition processing, and the substrate positioning operation, wherein after the substrate positioning operation, the moving operation of the imaging unit by the imaging unit moving mechanism is corrected on the basis of the inter-optical-axis relative position data and the surface correction data to execute the mark imaging operation and the mark recognition processing, and the positioning precision in a state before starting the production is evaluated on the basis of the recognition result in the mark recognition processing, wherein in a production post-start precision evaluation step that is executed for evaluating the positioning precision after starting the production, the moving operation of the imaging unit by the imaging unit moving mechanism is corrected on the basis of the inter-optical-axis relative position data and the surface correction data for a commercial production substrate and a commercial production mask to execute the mark imaging operation, the mark recognition processing, and the substrate positioning operation, and wherein after the substrate positioning operation, the moving operation of the imaging unit by the imaging unit moving mechanism is corrected on the basis of the inter-optical-axis relative position data and the surface correction data to execute the mark imaging operation and the mark recognition processing, and the substrate positioning precision in a state after starting the production is evaluated on the basis of the recognition result in the mark recognition processing.

Advantages of the Invention

According to the present invention, prior to the mark imaging that is obtained by imaging the substrate recognition mark formed on the substrate and the mask recognition mark formed on the mask plate by the imaging unit having two imaging optical axes, there are executed the optical axis calibration processing step of imaging the two reference marks associated with the relative positions by the imaging unit, individually, to detect the reference marks, and outputting the reference marks as the inter-optical-axis relative position data, and the surface correction data creation processing step of obtaining the position error of the imaging optical axis occurring on the imaging surface in the horizontal direction caused by the move of the imaging unit by the imaging unit moving mechanism, as a positional deviation in the horizontal direction for each of the reference points set in the ordered array for the substrate area and the mask area, respectively, and outputting the obtained position error as the surface correction data representing the local positional deviation state in respective planes of the substrate area and the mask area. With the above configuration, in order to correct the error of the horizontal relative position of the imaging optical axis in the mark imaging process, and to evaluate the positioning precision in the substrate positioning operation, the precision evaluation process is executed for the substrate and the mask for verification, and the precision evaluation process is executed for the substrate and the mask plate for the commercial production. This makes it possible to easily confirm whether the substrate positioning precision is high, or not, at the time of inspection before starting the production or during the production continuation processing.

BRIEF DESCRIPTION OF THE DRAWINGS

FIGS. 5(a) and 5(b) are illustrative views of positioning of a substrate and a mask plate in the screen printing device according to the embodiment of the present invention.

FIG. 11 is a flowchart illustrating production post-start precision evaluation processing in the screen printing method according to the embodiment of the present invention.

FIGS. 12(a) to 12(e) are illustrative views of processes of optical axis calibration processing in the screen printing method according to the embodiment of the present invention.

MODE FOR CARRYING OUT THE INVENTION

Figure 1:
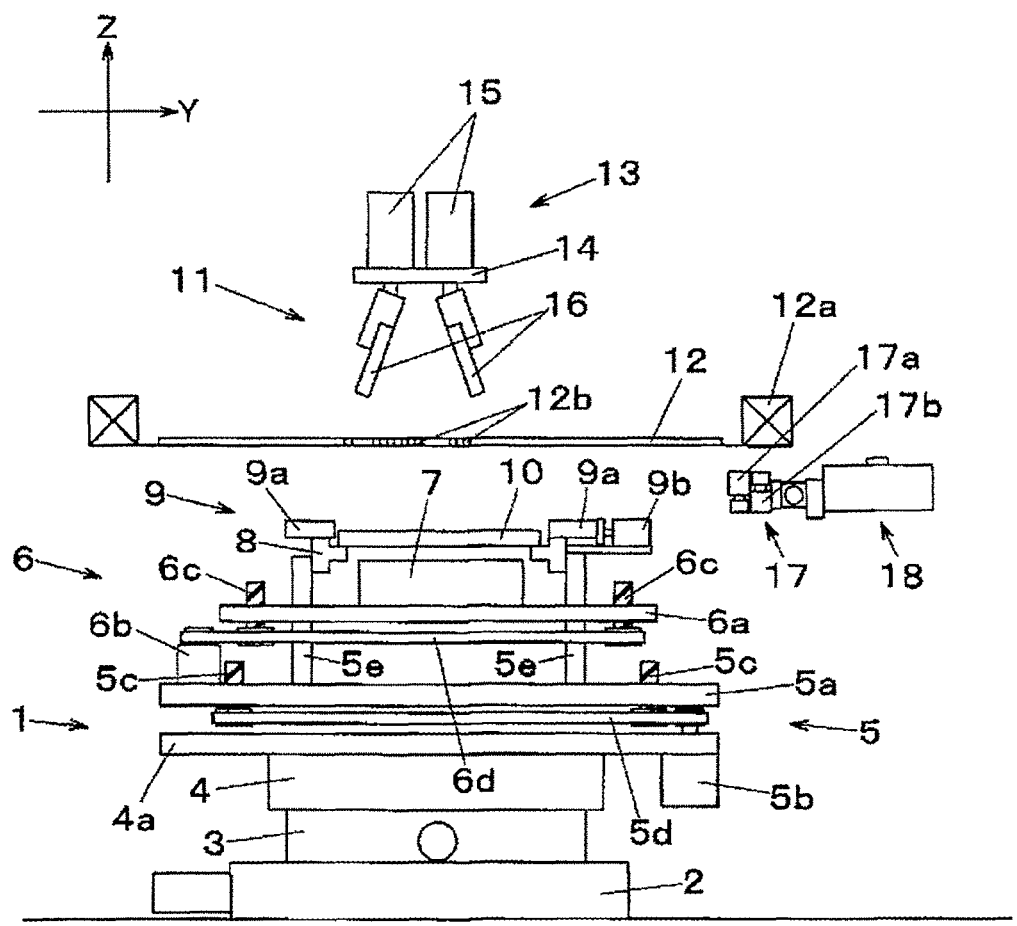
FIG. 1 is a side view of a screen printing device according to an embodiment of the present invention.

Subsequently, embodiments of the present invention will be described with reference to the drawings. First, a structure of a screen printing device will be described with reference to FIGS. 1, 2, and 3. Referring to FIG. 1, the screen printing device is configured to arrange a screen printing unit 11 above a substrate positioning unit 1. The substrate positioning unit 1 has a function of holding a substrate carried in from an upstream side, moving the substrate in a horizontal direction and a vertical direction, and positioning the substrate at a given position. The substrate positioning unit 1 is configured to stack a Y-axis table 2, an X-axis table 3, and a θ-axis table 4, and further combine a first Z-axis table 5 and a second Z-axis table 6 thereon.

A configuration of the first Z-axis table 5 will be described. On an upper surface side of a horizontal base plate 4a disposed on an upper surface of the θ-axis table 4, a horizontal base plate 5a that is similarly horizontal is up/down movably held by an elevating guide mechanism (not shown). The horizontal base plate 5a is moved up and down by a Z-axis elevator mechanism that is configured to rotationally drive a plurality of feed screws 5c through a belt 5d by a motor 5b.

Figure 2:
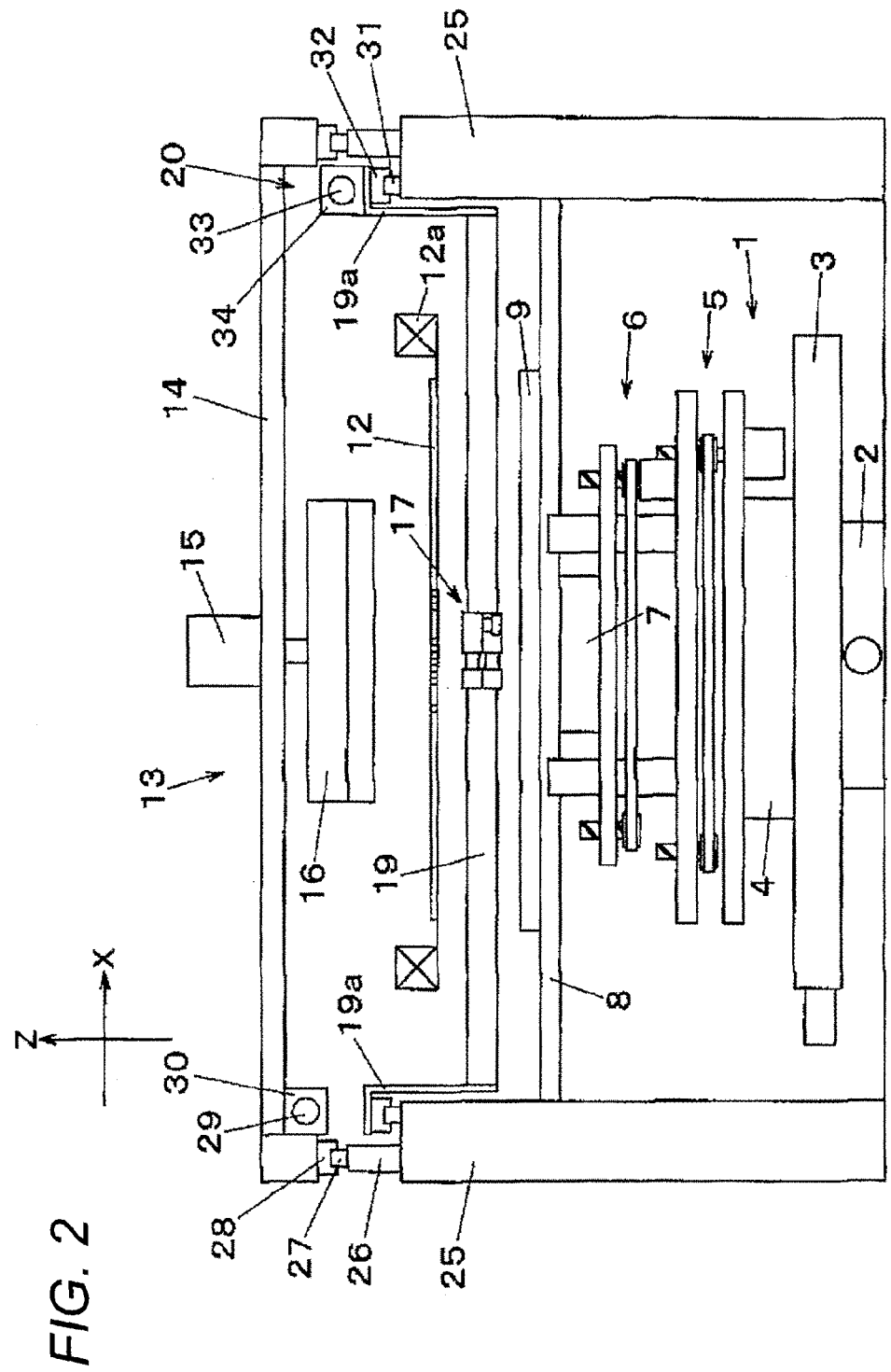
FIG. 2 is a front view of a screen printing device according to the embodiment of the present invention.
Figure 3:
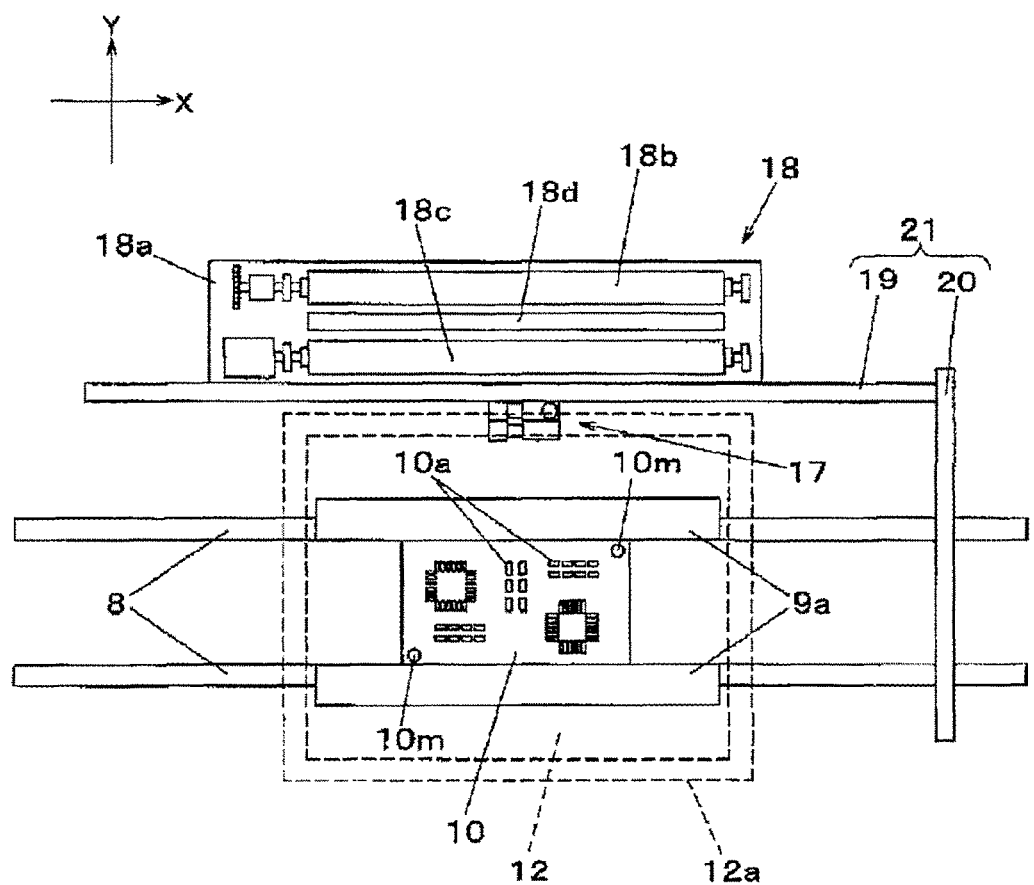
FIG. 3 is a plan view of a screen printing device according to the embodiment of the present invention.

A vertical frame 5e is erected on the horizontal base plate 5a, and a substrate transport mechanism 8 is held on an upper end portion of the vertical frame 5e. The substrate transport mechanism 8 has two transport rails which are arranged in parallel to a substrate transport direction (X-direction which is a direction perpendicular to a paper plane in FIG. 1). The substrate transport mechanism 8 transports a substrate 10 to be printed while supporting both ends of the substrate 10 by those transport rails. The substrate 10 that is held by the substrate transport mechanism 8 can be moved up and down together with the substrate transport mechanism 8 with respect to a screen print unit which will be described later, by driving the first Z-axis table 5. As illustrated in FIGS. 2 and 3, the substrate transport mechanism 8 extends to an upstream side (left side in FIGS. 2 and 3) and a downstream side, and the substrate 10 carried in from the upstream side is transported by the substrate transport mechanism 8, and further positioned by the substrate positioning unit 1. Then, the substrate 10 that has been printed by the screen printing unit 11 which will be described later is transported to the downstream side by the substrate transport mechanism 8.

A configuration of the second Z-axis table 6 will be described. A horizontal base plate 6a is up/down movably arranged along an elevator guide mechanism (not shown) in between the substrate transport mechanism 8 and the horizontal base plate 5a. The base plate 6a is moved up and down by the Z-axis elevator mechanism that is configured to rotationally drive a plurality of feed screws 6c through a belt 6d by a motor 6b. A substrate lower receiving unit 7 having a lower receiving surface for holding the substrate 10 on an upper surface thereof is disposed on an upper surface of the horizontal base plate 6a.

The substrate lower receiving unit 7 is moved up and down with respect to the substrate 10 which is held by the substrate transport mechanism 8 by driving the second Z-axis table 6. Then, the lower receiving surface of the substrate lower receiving unit 7 is abutted against a lower surface of the substrate 10 whereby the substrate lower receiving unit 7 supports the substrate 10 from the lower surface side. A clamp mechanism 9 is arranged on an upper surface of the substrate transport mechanism 8. The clamp mechanism 9 has two clamp members 9a arranged to horizontally face each other, and one of the clamp members 9a is moved forward and backward by a drive mechanism 9b to clamp and fix the substrate 10 from both sides thereof.

Subsequently, the screen printing unit 11 arranged above the substrate positioning unit 1 will be described. The screen printing unit 11 has a function of sliding a squeegee on the mask plate to which the past has been supplied, to thereby print the paste on the substrate through the pattern holes. Referring to FIGS. 1 and 2, a mask plate 12 is extended on a mask frame 12a, and pattern holes 12b are formed in the mask plate 12 in correspondence with the shape and position (refer to FIG. 3) of an electrode 10a to be printed on the substrate 10. A squeegee head 13 is arranged on the mask plate 12. In the squeegee head 13, a squeegee elevator mechanism 15 that moves up and down a squeegee 16 is arranged on a horizontal plate 14. The squeegee 16 is moved up and down by driving the squeegee elevator mechanism 15, and abutted against an upper surface of the mask plate 12.

As illustrated in FIG. 2, guide rails 27 are arranged in a Y-direction on brackets 26 arranged on a vertical frame 25, and sliders 28 that are slidably fitted to the respective guide rails 27 are coupled to both ends of the horizontal plate 14. As a result, the squeegee head 13 is slidable in the Y-direction. The horizontal plate 14 is horizontally moved in the Y-direction by a squeegee moving unit including a nut 30, a feed screw 29, and a squeegee moving motor (not shown) that rotationally drives the feed screw 29. Guide rails 31 are arranged on the vertical frame 25 in the Y-direction, and sliders 32 that are slidably fitted to the guide rails 31 are coupled to a head X-axis table 19 through brackets 19a. With the above configuration, the head X-axis table 19 is slidable in the Y-axis.

As illustrated in FIG. 3, the head X-axis table 19 is coupled with an imaging unit 17 that images the substrate 10 and the mask plate 12, and a cleaning mechanism 18 that cleans a lower surface of the mask plate 12. As illustrated in FIG. 1, the imaging unit 17 is configured to integrate a substrate recognition camera 17a that images the substrate 10, and a mask recognition camera 17b that images the mask plate 12 together. Also, as illustrated in FIG. 3, the cleaning mechanism 18 is configured to arrange a paper roll 18b where an unused cleaning paper is wound on a horizontal unit base 18a, a paper roll 18c on which a used cleaning paper is wound, and a cleaning head 18d that pushes the cleaning paper against a lower surface of the mask plate 12. The cleaning paper drawn out of the paper roll 18b is collected to the paper roll 18c through the cleaning head 18d.

The head X-axis table 19 is horizontally moved in the Y-direction by a head Y-axis moving mechanism 20 including a nut 34, a feed screw 33, and a head moving motor (not shown) that rotationally drives the feed screw 33. The imaging unit 17 and the cleaning mechanism 18 are horizontally moved in the X-direction and the Y-direction by driving the head X-axis table 19 and the head Y-axis moving mechanism 20, respectively. As a result, imaging on the mask plate 12 at an arbitrary position, and an overall area of a lower surface of the mask plate 12 can be cleaned. The head X-axis table 19 and the head Y-axis moving mechanism 20 configure an imaging unit moving mechanism 21 that moves the imaging unit 17 with respect to the substrate 10 and the mask plate 12 in the horizontal direction.

Subsequently, the print operation of the screen printing unit 11 will be described. First, when the substrate 10 is carried in at a print position by the substrate transport mechanism 8, the substrate lower receiving unit 7 is moved up by driving the second Z-axis table 6 to receive the lower surface of the substrate 10 from the bottom. Then, in this state, the substrate 10 is positioned with respect to the mask plate 12 by driving the substrate positioning unit 1. Thereafter, the substrate 10 is moved up together with the substrate transport mechanism 8 by driving the first Z-axis table 5, and abutted against the lower surface of the mask plate 12. Then, the substrate 10 is clamped by the clamp mechanism 9. With this operation, in the squeegeeing of the squeegee head 13, a horizontal position of the substrate 10 is fixed. Then, in this state, the squeegee 16 is slid on the mask plate 12 onto which a solder cream that is a paste is supplied with the result that the solder cream is printed on the substrate 10 through the pattern holes 12b.

Subsequently, the configuration and the function of the imaging unit 17 will be described with reference to FIGS. 4(*a*), 4(*b*), 4(*c*), and 4(*d*). As illustrated in FIG. 4(*a*), the imaging unit 17 coupled to the head X-axis table 19 is configured to arrange the mask recognition camera 17b having an upward imaging optical axis a2, and the substrate recognition camera 17a having a downward imaging optical axis a1 along the head X-axis table 19 in parallel to the Y-direction in a planar view. The respective imaging holes input from the directions of the imaging optical axes a1 and a2 are guided by an optical system 17c, and input to the substrate recognition camera 17a and the mask recognition camera 17b. With this operation, a substrate recognition mark formed on the substrate 10 and a mask recognition mark formed on the mask plate 12 are imaged. Then, the positioning operation of precisely aligning the relative positions of the substrate 10 and the mask plate 12 is executed on the basis of the position detection results of the substrate recognition mark and the mask recognition mark which are acquired by subjecting those imaging results to recognition processing.

Figure 4A:
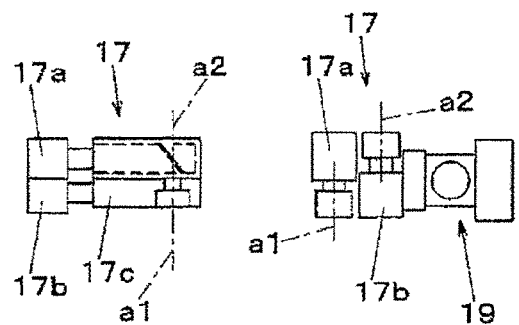
FIGS. 4(a), 4(b), 4(c), and 4(d) are illustrative views of the operation of the screen printing device according to the embodiment of the present invention.
Figure 4B:
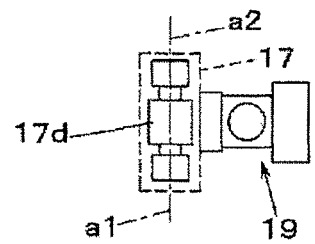

That is, the imaging unit 17 is moved by the imaging unit moving mechanism 21, and has the two imaging optical axes a1 and a2 whose imaging directions are downward and upward, respectively. The imaging unit 17 conducts the mark imaging operation of imaging the substrate recognition mark and the mask recognition mark formed on the substrate 10 and the mask plate 12, respectively. In this embodiment, the imaging unit 17 is configured to arrange the two imaging cameras having postures in which the imaging surfaces are oriented in opposite vertical directions, that is, the substrate recognition camera 17a and the mask recognition camera 17b in parallel in a plan view. The imaging unit 17 does not always need to provide two imaging cameras, but as illustrated in FIG. 4(b), the imaging unit 17 may be configured to include a single imaging camera 17d having the two imaging optical axes a1 and a2 whose respective imaging directions are downward and upward.

Figure 4C:
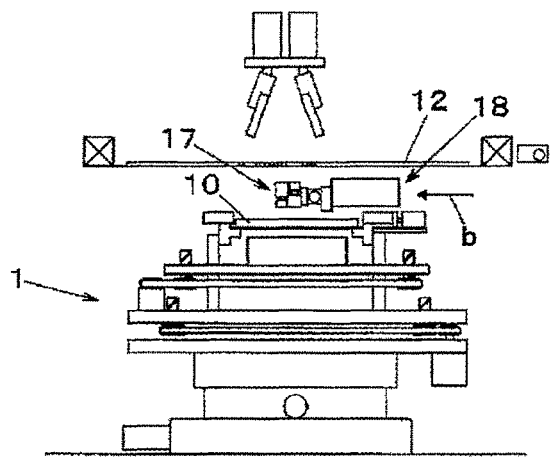

In the mark imaging operation of the imaging unit 17, as illustrated in FIG. 4(c), the imaging unit 17 and the cleaning mechanism 18 are integrally moved into between the substrate 10 held by the substrate positioning unit 1, and the mask plate 12 (arrow b). Then, in this state, the lower substrate 10 is imaged by the substrate recognition camera 17a whereas the upper mask plate 12 is imaged by the mask recognition camera 17b. In the imaging by the substrate recognition camera 17a and the mask recognition camera 17b, which are intended to position the substrate 10 and the mask plate 12 as described above, a relative positional relationship in an optical coordinate system between the two imaging cameras, in other words, a relative distance of the imaging optical axes on the respective imaging surfaces is required to be a specific dimension represented by a design dimension in advance.

Figure 4D:
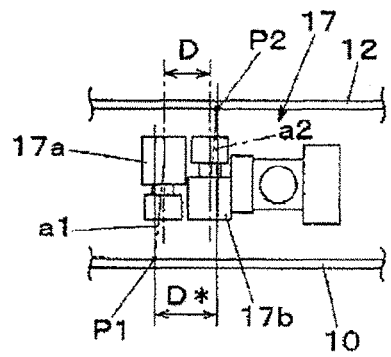

However, both of the imaging optical axes a1 and a2 are not always precisely oriented in a vertical direction. An optical axis error specific to the substrate recognition camera 17a and the mask recognition camera 17b, or an error of the mount posture of the substrate recognition camera 17a and the mask recognition camera 17b may cause the imaging optical axes a1 and a2 to be slightly inclined from an accurate vertical direction, as illustrated in FIG. 4(d). Because of the above causes, the relative distance of the two imaging optical axes a1 and a2 of the substrate recognition camera 17a and the mask recognition camera 17b on the respective imaging surfaces becomes a relative distance D* which is different from a specified dimension D represented by the design dimension. That is, the relative distance D* between an imaging point P1 representing a position of the imaging optical axis a1 on the upper surface of the substrate 10, and an imaging point P2 representing a position of the imaging optical axis a2 on the lower surface of the mask plate 12 becomes an inter-optical-axis relative position data representing the relative positional relationship of the respective coordinate systems of the substrate recognition camera 17a and the mask recognition camera 17b. In this embodiment, for the purpose of positioning the substrate 10 and the mask plate 12 with high precision, the inter-optical-axis relative position data is obtained by real measurement by a method which will be described later.

Subsequently, the positioning of the mask plate 12 and the substrate 10 will be described with reference to FIGS. 5(a) and 5(b). As illustrated in FIG. 5(a), the substrate 10 to be printed is formed with a pair of recognition marks 10m (substrate recognition marks) at diagonal positions. In the mask plate 12 extended on the mask frame 12a, a substrate region 12d corresponding to the substrate 10 is formed with a pair of recognition marks 12m (mask recognition marks) at diagonal positions, likewise. When the substrate positioning unit 1 is driven to position the substrate 10 with respect to the mask plate 12, a substrate center point 10c which is a midpoint of the two recognition marks 10m is aligned with a mask center point 12c which is a midpoint of the two recognition marks 12m. Also, a position of the substrate 10 is adjusted so that a direction of a diagonal line connecting the two recognition marks 10m is matched with a direction of the diagonal line connecting the two recognition marks 12m.

That is, as illustrated in FIG. 5(b), the position of the substrate 10 is adjusted on the basis of position detection results of the recognition marks 10m and 12m by the substrate recognition camera 17a and the mask recognition camera 17b so that positional deviations $\Delta x$ and $\Delta y$ between the substrate center point 10c and the mask center point 12c in a plane, and a deviation angle $\alpha$ formed between the two diagonal lines become as small as possible. As illustrated in FIG. 5(a), a recognition hole 12e and a recognition hole 9e, which are used for measurement of an inter-optical-axis relative position, are penetrated through a jig mask 12A and the clamp members 9a at the same position in a plan view, respectively. The recognition hole 12e and the recognition hole 9e are used as reference marks when the above-described inter-optical-axis relative position data is obtained by actual measurement (refer to FIGS. 12(a) to 12(e), and FIGS. 13(a), 13(b), and 13(c)). The recognition hole 12e may be formed in the mask plate 12 for commercial production for use as the jig mask 12A.

Figure 6:
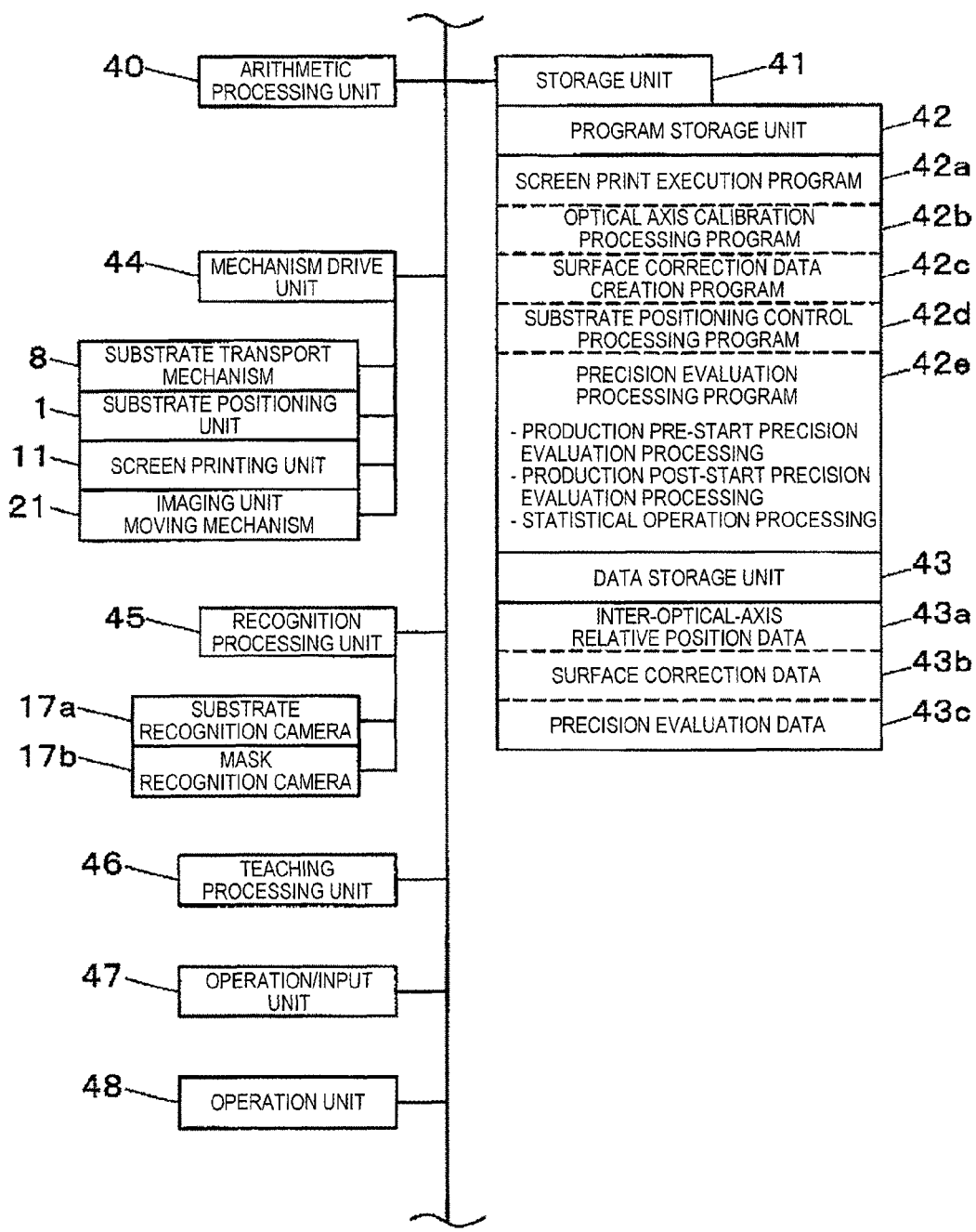
FIG. 6 is a block diagram illustrating a configuration of a control system in the screen printing device according to the embodiment of the present invention.

Subsequently, a configuration of a control system will be described with reference to FIG. 6. Referring to FIG. 6, an arithmetic processing unit 40 is a CPU. The arithmetic processing unit 40 executes a variety of operation and processing programs stored in a program storage unit 42 of a storage unit 41 on the basis of a variety of data stored in a data storage unit 43, to thereby control the respective units described below. As a result, screen print operation by the screen printing unit 11, and a variety of processing required in association with the print operation are executed.

In those operation and processing, a mechanism drive unit 44 is controlled by the arithmetic processing unit 40 to drive the substrate transport mechanism 8, the substrate positioning unit 1, the screen printing unit 11, and the imaging unit moving mechanism 21. Further, the imaging results of the substrate recognition camera 17a and the mask recognition camera 17b are subjected to recognition processing by a recognition processing unit 45, to thereby detect the positions of the recognition marks 10m and the recognition marks 12m of the substrate 10 and the mask plate 12 in the respective processing described below. Further, the position of the reference mark in the optical axis calibration processing, and the position of the reference point in the surface correction data creation processing are detected. That is, the recognition processing unit 45 subjects the imaging result of the marking imaging operation to the recognition processing, to thereby conduct the mark recognition processing of detecting the positions of the recognition marks 10m (substrate recognition mark) and the recognition marks 12m (mask recognition mark).

An operation/input unit 47 is an input unit such as a keyboard or a touch panel switch, and conducts an operation command or a variety of data inputs for operating the device. A display unit 48 is a display panel such as a liquid crystal panel, and displays a guide screen at the time of input through the operation/input unit 47 as well as a teaching screen in the respective processing which will be described later, that is, an operation screen when manually teaching the positions of the substrate 10 and the mask plate 12, which are imaged by the substrate recognition camera 17a and the mask recognition camera 17b, on the screen. A teaching processing unit 46 conducts data processing for the above-described teaching on the basis of manual input operation through the operation/input unit 47.

The program storage unit 42 stores a screen print execution program 42a, an optical axis calibration processing program 42b, a surface correction data creation program 42c, a substrate positioning control processing program 42d, and a precision evaluation processing program 42e therein. Also, the data storage unit 43 stores an inter-optical-axis relative position data 43a, a surface correction data 43b, and a precision evaluation data 43c therein. The arithmetic processing unit 40 executes the screen print execution program 42a, thereby allowing the screen printing unit 11 to execute a screen print operation. Also, the respective functions realized by executing the respective programs of the optical axis calibration processing program 42b, the surface correction data creation program 42c, the substrate positioning control processing program 42d, and the precision evaluation processing program 42e by the arithmetic processing unit 40 configure an optical axis calibration processing unit, a surface correction data creation processing unit, a substrate positioning control unit, and a precision evaluation unit, which will be described later.

Hereinafter, the functions of those units will be described. First, the optical axis calibration processing unit conducts the processing of detecting relative positions (refer to the relative distance D* illustrated in FIG. 4(d)) of the respective imaging optical axes a1 and a2 on the upper surface of the substrate 10 and the lower surface of the mask plate 12, which are the respective imaging surfaces of the imaging optical axes a1 and a2 of the substrate recognition camera 17a and the mask recognition camera 17b, and outputting the detected relative positions as the inter-optical-axis relative position data. In this example, the two reference marks associated with the relative positions are imaged by the substrate recognition camera 17a and the mask recognition camera 17b of the imaging unit 17, individually, to detect the relative positions of the imaging optical axes a1 and a2. Then, the detection of the relative positions is conducted by the teaching operation of aligning the two imaging optical axes a1 and a2 with the recognition hole 9e and the recognition hole 12e by the manual operation, individually, on the teaching screen where the two reference marks (recognition hole 9e and recognition hole 12e illustrated in FIG. 5(a)) associated with the relative positions are imaged, individually. The output data is stored in the data storage unit 43 as the inter-optical-axis relative position data 43a. In the substrate positioning operation, a positioning error attributable to a fact that a real inter-optical-axis relative position is different from a numerical value on a design data is corrected by conducting a correction by using the inter-optical-axis relative position data 43a.

The surface correction data creation processing unit conducts the processing of obtaining a position error of the imaging optical axes a1 and a2 occurring on the imaging surface in the horizontal direction caused by the move of the imaging unit 17 by the imaging unit moving mechanism 21, as a positional deviation in the horizontal direction which is specific to each of reference points set in an ordered array for a substrate area (a glass substrate 10B held for surface correction by the substrate positioning unit 1 in this example) on which the substrate 10 is held, and a mask area (a jig mask 12B installed for surface correction on the mask frame 12a in this example) on which the mask plate 12 is installed, respectively, and outputting the obtained position error as surface correction data representing a local positional deviation state in respective planes of the substrate area and the mask area. The output data is stored in the data storage unit 43 as the surface correction data 43b. In the substrate positioning operation, the positioning detection error by the imaging unit 17, which is caused by a local drive error of the imaging unit moving mechanism 21 can be corrected by conducting a correction by using the surface correction data 43b.

Figure 14A:
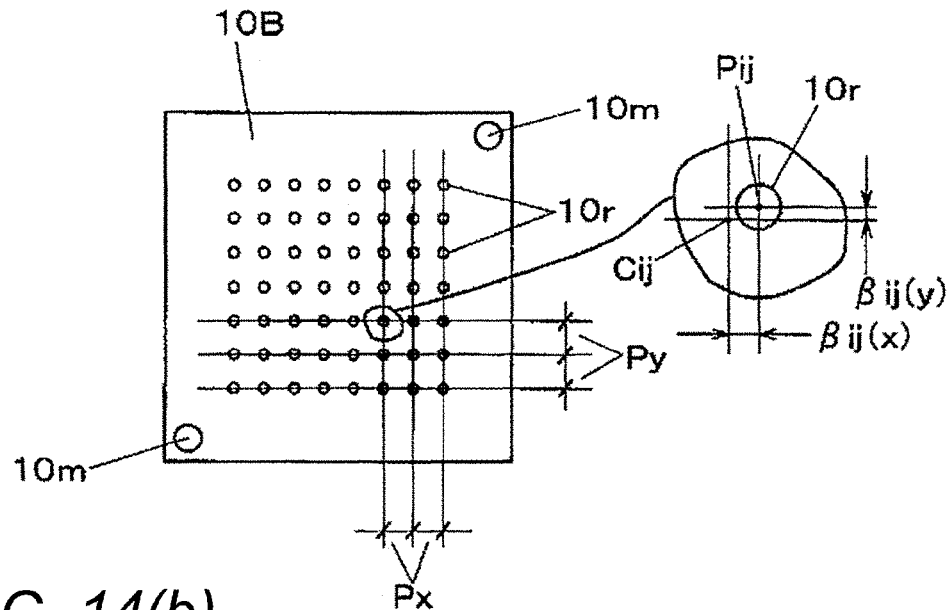
FIGS. 14(a) and 14(b) are diagrams illustrating a glass substrate and a jig mask for calibration used in the surface correction data creation processing in the screen printing method according to the embodiment of the present invention.
Figure 14B:
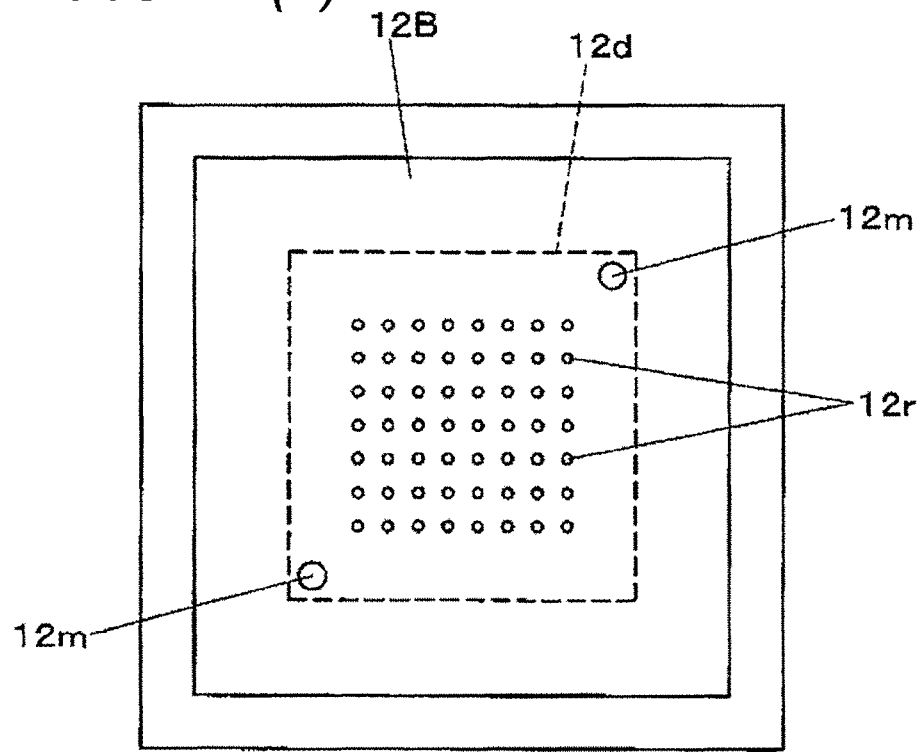

In the optical axis calibration processing, and the surface correction data creation processing described above, an image in which the reference marks (recognition hole 12e, recognition hole 9e) formed on the jig mask (jig mask 12A illustrated in FIG. 5(a)) and the clamp members 9a, and reference points 10r and 12r set in the calibration substrate and the calibration mask (glass substrate 10B and jig mask 12B illustrated in FIGS. 14(a) and 14(b)) are imaged by the substrate recognition camera 17a and the mask recognition camera 17b, individually, is displayed on a teaching screen in the display unit 48, and the teaching operation of aligning the imaging optical axes a1 and a2 with the reference marks and the reference points through the manual operation, individually, is conducted.

That is, the operator conducts the teaching operation by the operation/input unit 47 on a display screen displayed in the display unit 48 to teach the positions of the reference marks and the reference points described above by the teaching processing unit 46. As a result, positions from the above-described reference marks or reference points are taught by the teaching processing unit 46. As a result, positions of the respective reference points from an origin in the optical coordinate system, that is, the positional deviation is detected. That is, the surface correction data creation processing unit detects the positional deviation for each of the reference points through the teaching operation of aligning the two imaging optical axes a1 and a2 with their reference points, on the teaching screen on which the reference points are imaged, through the manual operation, individually.

The substrate positioning control unit controls the imaging unit 17, the imaging unit moving mechanism 21, and the recognition processing unit 45 to execute the mark recognition processing of detecting the positions of the recognition marks 10m and the recognition marks 12m by the mark imaging operation of imaging the recognition marks 10m formed on the substrate 10 and subjecting the imaging result in the mark imaging operation to recognition processing. Further, the substrate positioning control unit controls the substrate positioning unit 1 on the basis of the inter-optical-axis relative position data 43a and the surface correction data 43b stored in the data storage unit 43, and the results of the mark recognition processing to execute the substrate positioning operation of positioning the substrate 10 and the mask plate 12.

The precision evaluation unit conducts the processing for evaluating the substrate positioning precision in the substrate positioning operation. In this embodiment, the configuration of the precision evaluation processing includes three kinds of processing including production pre-start precision evaluation processing of evaluating the substrate positioning precision prior to starting the production, production post-start precision evaluation processing of evaluating the substrate positioning precision at an arbitrary time during production continuation after starting the production, and statistical operation processing of statistically processing data acquired by the precision evaluation processing to obtain a process capability index of the device.

First, in the production pre-start precision evaluation processing, prior to starting the production by the screen printing device, the mark imaging operation, the mark recognition processing, and the substrate positioning operation described above are executed for the verification substrate and the verification mask which are produced in advance for verifying the substrate positioning precision of the substrate 10 and the mask plate 12, and each have reference points set in an ordered array. In this example, the verification substrate and the verification mask identical with the glass substrate 10B and the jig mask 12B described above are used. That is, the moving operation of the imaging unit 17 by the imaging unit moving mechanism 21 is corrected on the basis of the inter-optical-axis relative position data 43a and the surface correction data 43b for the verification substrate and the verification mask, and the above mark imaging operation, the mark recognition processing, and the substrate positioning operation are executed. Then, after the above substrate positioning operation, the moving operation of the imaging unit 17 by the imaging unit moving mechanism 21 is corrected on the inter-optical-axis relative position data 43a and the surface correction data 43b to again execute the mark imaging operation and the mark recognition processing. The positioning precision in a state before starting the production is evaluated on the basis of the recognition result in the mark recognition processing. Then, the operation processing for the precision evaluation is repetitively executed to confirm the repetitive positioning precision.

Then, in the production post-start precision evaluation process, after starting the production by the screen printing device, the mark imaging operation, the mark recognition processing, and the substrate positioning operation described above are executed for the substrate 10 and the mask plate 12 for the commercial production. That is, the moving operation of the imaging unit 17 by the imaging unit moving mechanism 21 is corrected on the basis of the inter-optical-axis relative position data 43a and the surface correction data 43b for the substrate 10 and the mask plate 12 to execute the mark imaging operation, the mark recognition processing, and the substrate positioning operation. Then, after the substrate positioning operation, the moving operation of the imaging unit 17 by the imaging unit moving mechanism 21 is corrected on the basis of the inter-optical-axis relative position data 43a and the surface correction data 43b to execute the mark imaging operation and the mark recognition processing. The positioning precision in a state after starting the production is evaluated on the basis of the recognition result in the mark recognition processing.

In this embodiment, in the above-described production post-start precision evaluation processing, the operation processing for the precision evaluation is repetitively executed before and after the screen printing operation for a predetermined number of the substrates 10. As a result, an influence of the execution of the screen print operation on the substrate positioning precision can be evaluated in addition to the repetitive confirmation of the positioning precision.

Then, in the statistic operation processing, plural pieces of positioning precision data acquired by repetitively executing the positional deviation measurement in each of the production pre-start precision evaluation processing and the production post-start precision evaluation processing, that is, plural pairs of positional deviations $\Delta x$ and $\Delta y$, and the deviation angle $\alpha$ illustrated in FIG. 5(b) are subjected to statistical processing, to thereby calculate a process capability index Cpk indicative of a precision management level in the substrate positioning of the device. Those positioning precision data and the calculated process capability index Cpk are stored in the data storage unit 43 as the precision evaluation data 43c. That is, the above-described precision evaluation unit has a statistical arithmetic processing unit that acquires the evaluation data representing the positioning precision by a plurality of times, and subjects the plural pieces of evaluation data to the statistical processing to calculate the process capability index Cpk of the substrate positioning precision in the screen printing device. As a result, a precision level of the substrate positioning in the screen printing device can be always quantitatively grasped.

Figure 7:
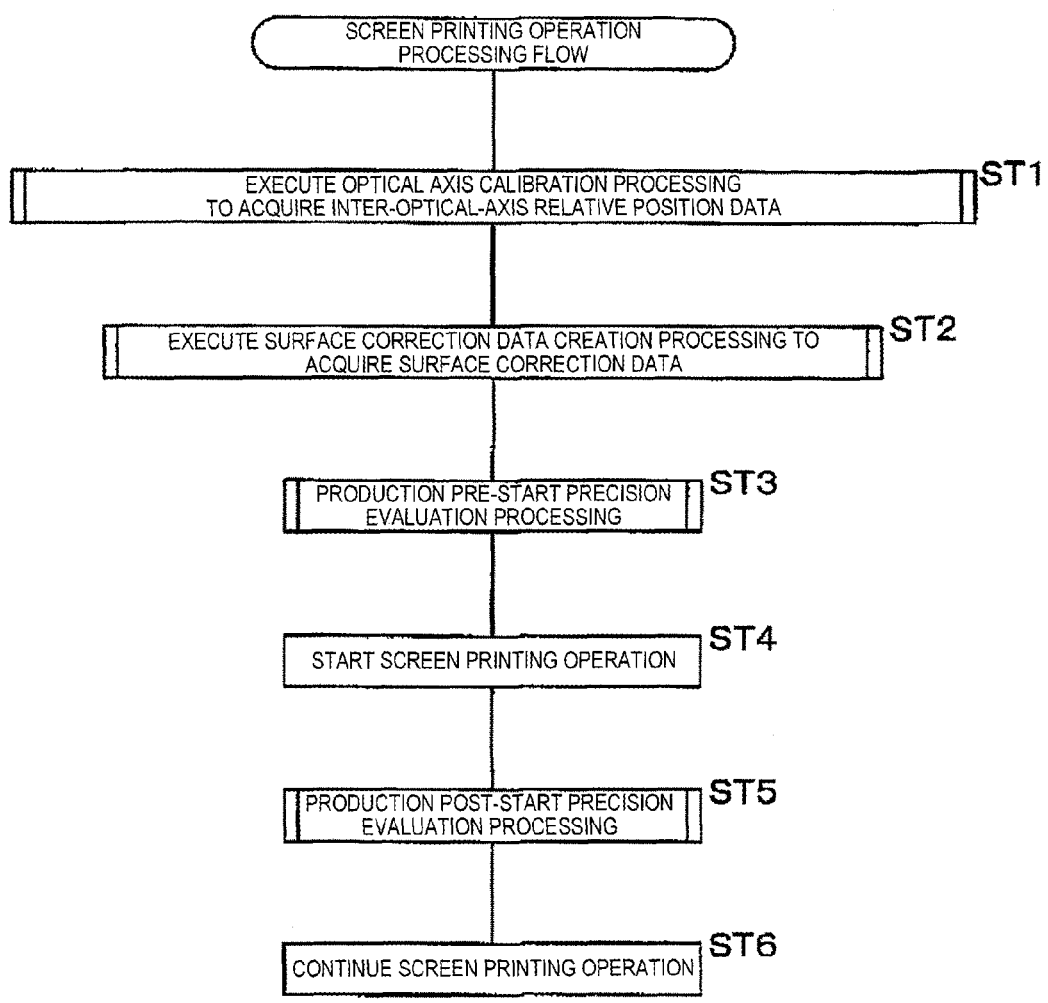
FIG. 7 is a flowchart illustrating working processing in a screen printing method according to the embodiment of the present invention.

Subsequently, a description will be given of the operation processing in the screen printing with reference to FIG. 7 and the subsequent figures. First, a description will be given of an overall flow of the screen printing operation processing in the screen printing device with reference to FIG. 7. First, the surface correction data creation program 42c is executed by the use of the jig mask 12A (FIG. 5(a)), to thereby execute the optical axis calibration processing, acquire the inter-optical-axis relative position data 43a, and store the acquired data in the data storage unit 43 (ST1). Then, the surface correction data creation processing is executed on the basis of the surface correction data creation program 42c with the use of the jig mask 12B (FIG. 14(b)), acquires the surface correction data 43b, and stores the acquired data in the data storage unit 43 (ST2). As a result, a positioning error caused by an error in the relative position of the imaging optical axes a1 and a2, and a local positioning error caused by a drive error of the imaging unit moving mechanism 21 can be corrected in the imaging of the substrate recognition camera 17a and the mask recognition camera 17b.

Subsequently, the production pre-start precision evaluation processing is executed (ST3). This processing is executed for the purpose of verifying that a desired repetitive positioning precision is ensured by the aid of the inter-optical-axis relative position data 43a and the surface correction data 43b, in the substrate positioning operation which is executed with the use of the substrate positioning control processing program 42d. The production pre-start precision evaluation processing is conducted with the use of the verification substrate and the verification mask (glass substrate 10B and jig mask 12B in this example) by the user. Then, if it is verified that the desired repetitive positioning precision is ensured in the production pre-start precision evaluation processing, the screen printing operation using the mask plate 12 starts for the commercial production substrate 10 (ST4).

In the screen printing operation, the substrate 10 carried from an upstream side is held by the substrate positioning unit 1 (substrate holding process). Then, the recognition marks 10m formed on the substrate 10, and the recognition marks 12m formed on the mask plate 12 installed on the screen printing unit 11 are imaged by the imaging unit 17 having two imaging optical axes a1 and a2 whose imaging directions are upward and downward, respectively, and which is moved in the horizontal direction with respect to the substrate 10 and the mask plate 12 by the imaging unit moving mechanism 21 (mark imaging process). Then, the imaging result in the mark imaging process is subjected to the recognition processing by the recognition processing unit 45, to thereby detect the positions of the recognition marks 10m and the recognition marks 12m (mark recognition processing process).

Then, the substrate positioning unit 1 is controlled on the basis of the position detection results of the recognition marks 10m and the recognition marks 12m, to thereby position the substrate 10 to the mask plate 12 (substrate positioning process). Then, the squeegee 16 is slid on the mask plate 12 having the pattern holes 12b formed therein to which a paste is supplied, to thereby print the paste on the substrate 10 through the pattern holes 12b (screen printing process). Then, the screen printing operation is repetitively executed on a plurality of the substrates 10.

In a process of thus continuously executing the screen printing operation, the production post-start precision evaluation processing is executed (ST5). This processing is executed at given intervals with the use of the substrate 10 and the mask plate 12 for the real production for the purpose of verifying that the desired repetitive positioning precision verified in the production pre-start precision evaluation processing is still maintained during continuation of the production. Then, if it is confirmed that the desired repetitive positioning precision is maintained in the production post-start precision evaluation processing, the screen printing operation is continued (ST6).

Figure 8:
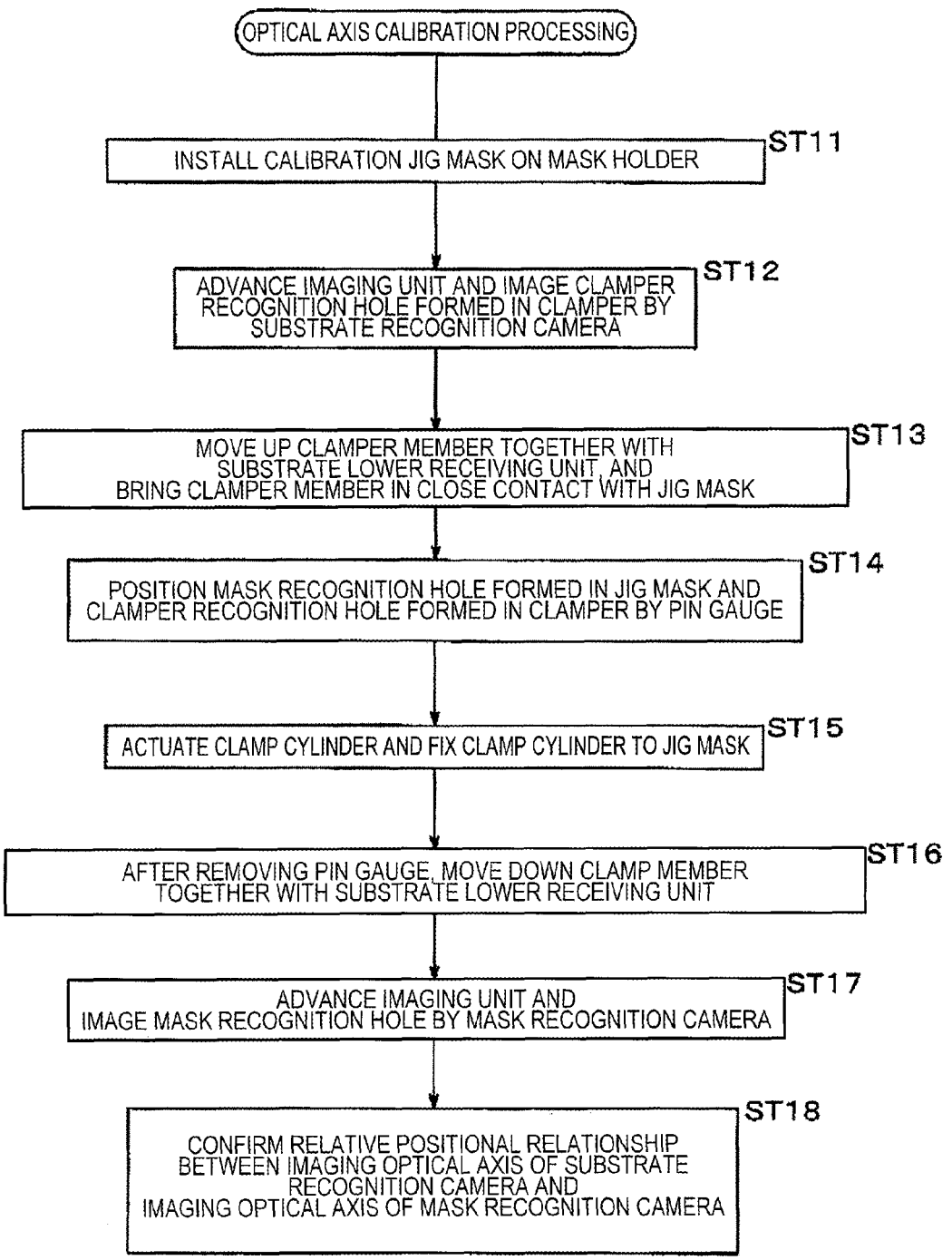
FIG. 8 is a flowchart illustrating optical axis calibration processing in the screen printing method according to the embodiment of the present invention.

Subsequently, the details of the respective processing executed in the above-described overall flow will be described. First of all, a detailed flow of the optical axis calibration processing represented in (ST1) in FIG. 7 will be described with reference to FIGS. 8, 12(*a*) to 12(*e*), 13(*a*), 13(*b*), and 13(*c*). This processing is executed prior to the mark imaging process in the above-described screen printing operation. In this example, an optical axis calibration processing unit that detects the relative positions of the respective imaging optical axes a1 and a2 in the horizontal direction on the substrate upper surface and the mask lower surface which are the respective imaging surfaces of the imaging optical axes a1 and a2 of the substrate recognition camera 17a and the mask recognition camera 17b are detected by imaging two reference marks associated with the relative positions by the imaging unit 17, individually, and outputs the detected relative positions as the inter-optical-axis relative position data 43a (optical axis calibration processing process).

First, as illustrated in FIG. 12(*a*), the jig mask 12A for calibration is installed on the mask frame 12a (ST11). As illustrated in FIG. 5(*a*), the jig mask 12A is formed with the recognition hole 12e in correspondence to the position of the recognition hole 9e formed in the clamp member 9a. Then, as illustrated in FIG. 12(*b*), the imaging unit 17 is advanced (arrow c), and the recognition hole 9e formed in the clamp member 9a is imaged by the substrate recognition camera 17a (ST12). Then, after the imaging unit 17 has been retreated from above of the substrate positioning unit 1, the clamp member 9a is moved up together with the substrate lower receiving unit 7, and is brought in close contact with the mask plate 12 (ST13). In this state, as illustrated in FIG. 12(*c*), the recognition hole 12e formed in the mask plate 12 and the recognition hole 9e formed in the clamp member 9a are positioned by inserting a clamp pin 35 through those holes (ST14). Thereafter, as illustrated in FIG. 12(*d*), mask clamp cylinders 36 are actuated (arrow d), and the mask frame 12a is pushed from above to fix the mask plate 12 (ST15). As a result, the position of the recognition hole 12e formed in the mask plate 12 is also fixed.

Thereafter, after the clamp pin 35 has been removed from the recognition hole 12e and the recognition hole 9e, the clamp member 9a is moved down together with the substrate lower receiving unit 7 (ST16). Then, as illustrated in FIG. 12(*a*), the imaging unit 17 is advanced, and the recognition hole 12e is imaged by the mask recognition camera 17b (ST17). The imaging results by the substrate recognition camera 17a and the mask recognition camera 17b are subjected to the recognition processing by the recognition processing unit 45, to thereby detect the positions of the recognition hole 9e and the recognition hole 12e. Then, the relative positional relationship between the imaging optical axis a1 of the substrate recognition camera 17a and the imaging optical axis a2 of the mask recognition camera 17b is confirmed on the basis of the position detection result of the recognition hole 9e and the position detection result of the recognition hole 12e (ST18).

FIGS. 13(*a*), 13(*b*), and 13(*c*) illustrate a method of acquiring the inter-optical-axis relative position data 43a in the above-described optical axis calibration processing. That is, in FIG. 12(*e*) illustrating a state after the clamp pin 35 has been removed, as illustrated in FIG. 13(*a*), the recognition hole 12e of the mask plate 12 and the recognition hole 9e of the clamp member 9a are in an alignment state (refer to alignment line AL) in which the plane positions of the respective center points C1 and C2 are aligned with each other.

Then, as illustrated in FIG. 13(*b*), the imaging point P1 of the imaging optical axis a1 of the substrate recognition camera 17a is matched with the center point of the recognition hole 9e to recognize the position. Thereafter, as illustrated in FIG. 13(*c*), in the alignment state in which the plane positions of the respective center points C1 and C2 are aligned with each other, the imaging point P2 of the imaging optical axis a2 of the mask recognition camera 17b is aligned with the center point of the recognition hole 12e to recognize the position. This makes it possible to detect the relative positional relationship of the respective optical coordinate systems of the substrate recognition camera 17a and the mask recognition camera 17b, that is, the horizontal relative positions of the imaging optical axes a1 and a2 on the respective imaging surfaces. As a result, the position recognition results detected by the two individual optical coordinate systems of the substrate recognition camera 17a and the mask recognition camera 17b can be obtained as positions in a common coordinate system. This makes it possible to correct the position detection error attributable to a fault of the positional relationship between those optical coordinate systems.

In the example of this embodiment, the recognition hole 9e and the recognition hole 12e respectively formed in the clamp member 9a and the jig mask 12A are used as the two reference marks, and as a method of associating the relative positions of those holes with each other, there is used a method of inserting the clamp pin 35 through those holes. Those two reference marks may be reference marks having a configuration other than that in the example shown in this embodiment if a mutual relationship of those two reference marks is associated with some means.

Figure 15A:
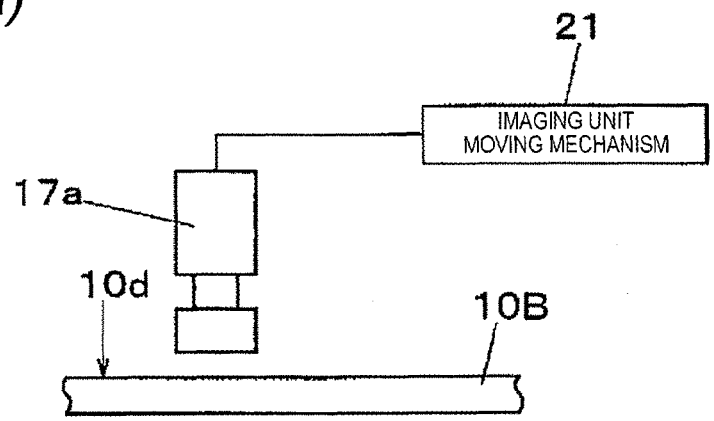
FIGS. 15(a) to 15(c) are illustrative views of processes of the surface correction data creation processing in the screen printing method according to the embodiment of the present invention.
Figure 15B:
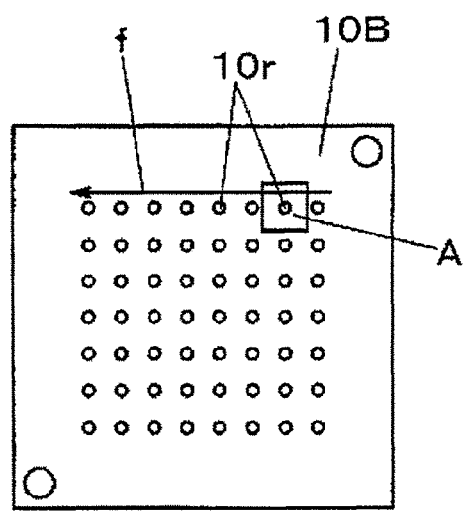
Figure 15C:
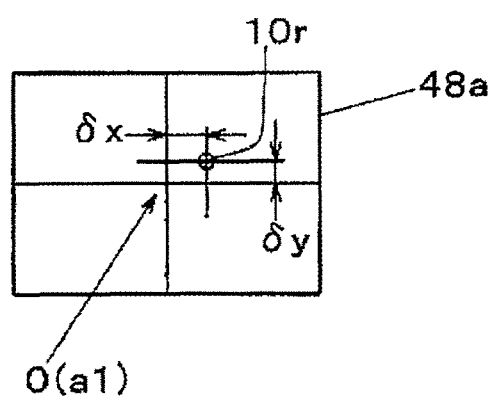

Subsequently, a detailed flow of the surface correction data creation processing shown in (ST2) of FIG. 7 will be described with reference to FIGS. 9, 14(*a*) and 14(*b*), and FIGS. 15(*a*), 15(*b*), and 15(*c*). The surface correction data creation processing is executed prior to the mark imaging process in the above-described screen printing operation. In this example, a position error of the imaging optical axes a1 and a2 occurring on the imaging surfaces in the horizontal direction caused by the move of the imaging unit 17 by the imaging unit moving mechanism 21 is obtained as a positional deviation in the horizontal direction which is specific to each of reference points set in an ordered array for a substrate area on which the substrate is held and a mask area on which a mask plate is installed, respectively, and outputs the obtained position error as surface correction data representing a local positional deviation state in the respective planes of the substrate area and the mask area (surface correction data creation processing process).

In the surface correction data creation processing, the glass substrate 10B and the jig mask 12B illustrated in FIGS. 14(*a*) and 14(*b*) are used. As illustrated in FIG. 14(*a*), the glass substrate 10B has the same outer diameter dimension as that of the substrate 10 for commercial product to be worked, and is provided with the same recognition marks 10m as those on the substrate 10. Further, on the glass substrate 10B, the reference points 10r for conducting the surface correction, which corrects the positional deviation caused by a local drive error of the imaging unit moving mechanism 21 when the imaging unit 17 is moved by the imaging unit moving mechanism 21 within the substrate area, are set at the respective intersections of grid lines having pitches px and py.

In the surface correction data creation, those reference points 10*r* are imaged and positionally detected while the substrate recognition camera 17*a* is moved by the imaging unit moving mechanism 21, to thereby obtain the surface correction data for correcting the position in the optical coordinate system of the substrate recognition camera 17*a* and the real position. In this example, in order to prevent the position error of the reference points 10*r* unavoidably occurring in the manufacturing process of the glass substrate 10B from lessening the reliability of the surface correction data, in this embodiment, in a manufacturer of the glass substrate 10B, the result of precisely measuring βij(x) and βij(y) representing the positional deviation error from a grid point Cij, which is a regular position of each reference point 10*r*, in advance, is created as a calibration data for each serial No. which is ID data specific to each glass substrate 10B, and attached to the glass substrate 10B.

FIG. 14(*b*) illustrates the jig mask 12B used for creating the surface correction data of the mask recognition camera 17*b* that recognizes the mask plate 12. In the jig mask 12B, as with the recognition marks 10*m* and the reference points 10*r* in the glass substrate 10B shown in FIG. 14(*a*), the recognition marks 12*m* and the reference points 12*r* are provided within the substrate region 12*d* indicative of a range corresponding to the glass substrate 10B. In the surface correction data creation, those reference points 12*r* are imaged to detect the position thereof while the mask recognition camera 17*b* is moved by the imaging unit moving mechanism 21, to thereby obtain the surface correction data for correcting the position in the optical coordinate system of the mask recognition camera 17*b* and the real position.

As with the calibration data in the reference points 10*r* on the glass substrate 10B, in the jig mask 12B, the calibration data is created for each serial No. which is ID data specific to each jig mask 12B, and attached to the jig mask 12B. Then, in creating the surface correction data for the substrate area and the mask area, an influence of the positional deviation errors of the reference points 10*r* and 12*r* on the glass substrate 10B and the jig mask 12B is removed taking those calibration data into account. That is, in the surface correction data creation processing process, in any one or both of the glass substrate 10B for calibration and the jig mask 12B for calibration, the surface correction data is created taking into account the calibration data obtained by measuring the positional deviations from the regular positions of the respective reference points 10*r* and 12*r* in advance.

Figure 9:
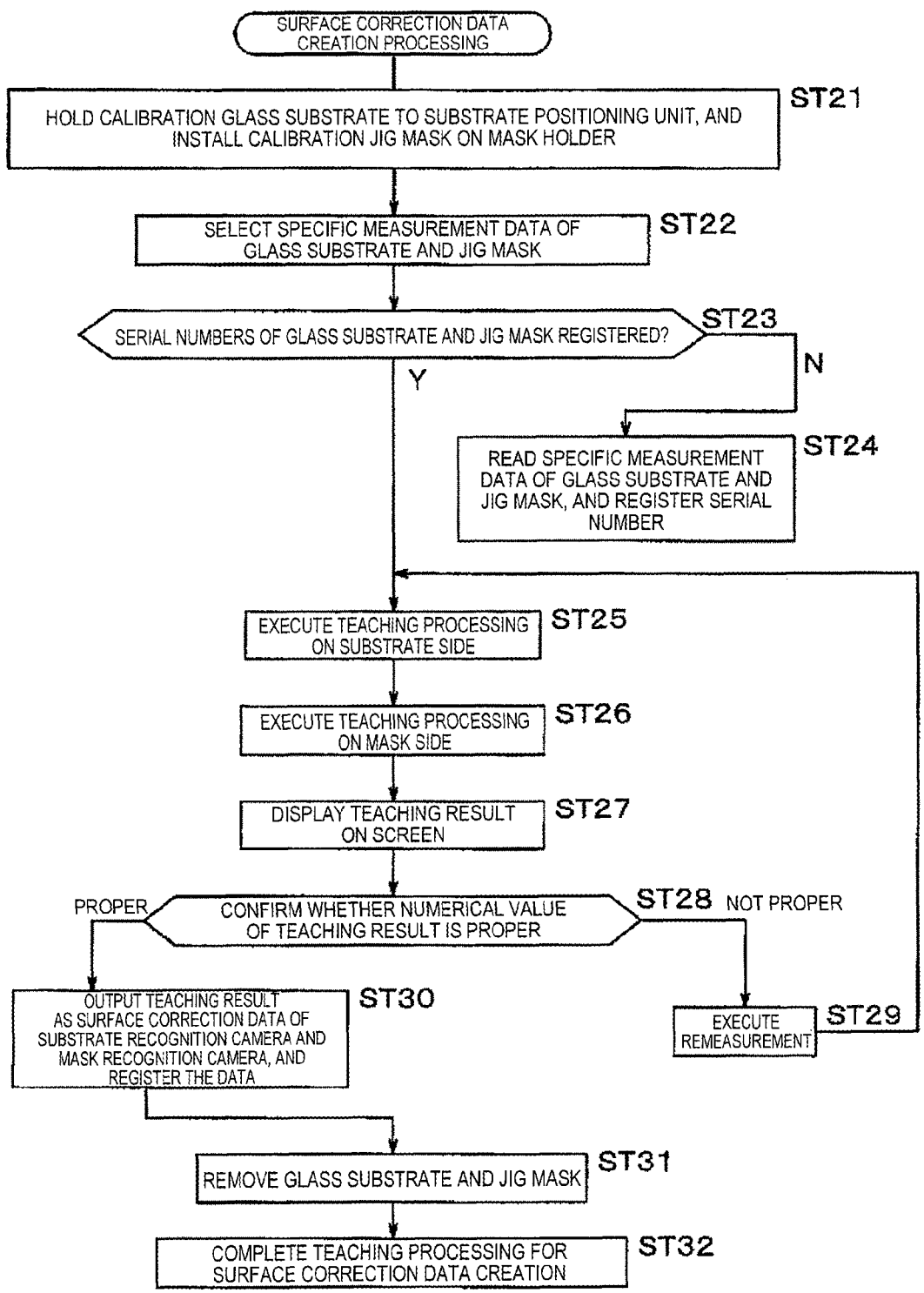
FIG. 9 is a flowchart illustrating surface correction data creation processing in the screen printing method according to the embodiment of the present invention.

Referring to FIG. 9, the glass substrate 10B for calibration is first held in the substrate positioning unit 1, and the jig mask 12B for calibration is installed (ST21). That is, the glass substrate 10B for calibration on which the reference points are formed in the ordered array is held in the substrate area, and the jig mask 12B for calibration on which the reference points are formed in the ordered array is installed in the mask area. Then, the specific measurement data of the glass substrate 10B and the jig mask 12B, that is, the calibration data attached to the glass substrate 10B and the jig mask 12B is selected on the basis of the serial Nos. of the glass substrate 10B and the jig mask 12B (ST22).

In this example, it is determined whether the serial Nos. of the glass substrate 10B and the jig mask 12B have already been registered, or not (ST23). In this situation, if serial Nos. have not yet been registered, the calibration data which is the specific measurement data of the glass substrate 10B and the jig mask 12B is read to register the serial Nos. of the glass substrate 10B and the jig mask 12B (ST24). With the above operation, the teaching processing for the glass substrate 10B and the jig mask 12B is enabled.

First of all, the teaching processing on the substrate side is executed (ST25). That is, as illustrated in FIG. 15(*a*), the substrate recognition camera 17*a* is moved above the glass substrate 10B by the imaging unit moving mechanism 21 to image a substrate front surface 10*d*. In this situation, as illustrated in FIG. 15(*b*), an imaging visual field A of the substrate recognition camera 17*a* is moved along the grid lines on which the reference points 10*r* are formed (arrow f), and a teaching screen that images those reference points 10*r* are displayed on the display unit 48 (FIG. 6). As a result, the teaching screen illustrated in FIG. 15(*c*) is displayed on a display panel 48*a* of the display unit 48. In this situation, the position of the reference points 10*r* on the imaged screen in a state where the imaging optical axis a1 is moved to the position of the reference points 10*r* on the control data, and an origin O (corresponding to the position of the imaging optical axis a1) of the optical coordinate system do not always match each other due to the drive error of the imaging unit moving mechanism 21, and are positionally deviated from each other by positional deviations δx and δy corresponding to the drive error.

In order to detect such positional deviations δx and δy, the operator conducts the teaching operation for teaching the position of the reference points 10*r*. That is, the operator operates the operation/input unit 47 to finely move the imaging unit moving mechanism 21 so that the origin O of the optical coordinate system on the teaching screen matches the reference points 10*r* on the teaching screen. As a result, the teaching processing unit 46 detects the small amount of motion of the imaging unit moving mechanism 21 as the positional deviations 5*x* and 5*y*. Then, the teaching operation is executed on all of the reference points 10*r* on the glass substrate 10B, to thereby complete the teaching processing on the substrate side. Then, likewise, the teaching processing on the mask side is executed (ST26). In this example, the mask recognition camera 17*b* is moved below the jig mask 12B by the imaging unit moving mechanism 21, and the mask lower surface is imaged. As a result, as in the above description, the operator conducts the teaching operation of teaching the position of the reference points 12*r* set in a lattice arrangement on the jig mask 12B.

If the teaching processing on the substrate side and the mask side is completed in the above manner, the teaching result is displayed on the screen of the display unit 48 (ST27). Then, the operator confirms whether a numerical value of the displayed teaching result is proper, or not (ST28). If it is determined that the numerical value of the teaching result is not proper in (ST28), the processing of (ST25) and the subsequent steps is repetitively executed until it is determined that the numerical value is proper in (ST28). Then, if it is determined that the teaching result is proper in (ST28), the teaching results are output as the surface correction data 43*b* of the substrate recognition camera 17*a* and the mask recognition camera 17*b*, and stored and registered in the data storage unit 43 (ST30). Thereafter, the glass substrate 10B and the jig mask 12B are removed (ST31), and the teaching process for creation of the surface correction data is completed (ST32).

Thus, when the inter-optical-axis relative position data 43*a* is obtained and stored, there can be corrected a mounting positional deviation of the substrate recognition camera 17*a* and the mask recognition camera 17*b*, and the positioning error of the substrate 10 and the mask plate 12 caused by an error of the inter-optical-axis relative distance attributable to the inclination of the imaging optical axis a1 or the imaging optical axis a2. Also, when the surface correction data 43b is obtained and stored, there can be corrected a position recognition error by the substrate recognition camera 17a or the mask recognition camera 17b which is caused by a local mechanical error of a direct operated mechanism configuring the imaging unit moving mechanism 21. Accordingly, even if the substrates 10 different in size are targeted, and the position of the recognition mark which is the standard of positioning is different in each of the substrates, the position of the recognition mark can be always detected with high precision, and the positioning precision between the substrate 10 and the mask plate 12 can be improved.

Subsequently, a detailed flow of the production pre-start precision evaluation processing shown in (ST3) of FIG. 7 will be described with reference to FIG. 10. The production pre-start precision evaluation processing is executed for evaluating the positioning precision in the substrate positioning operation, in particular, the repetitive positioning precision when repetitively executing the same operation, before starting the production of the above-described screen printing operation.

In this example, the glass substrate 10B as the verification substrate and the jig mask 12B as the verification mask, which are prepared for verifying the positioning precision of the substrate and the mask plate in advance, and have the reference points set in the ordered array, are targeted, the moving operation of the imaging unit 17 by the imaging unit moving mechanism 21 is corrected on the basis of the inter-optical-axis relative position data 43a and the surface correction data 43b to execute the mark imaging operation, the mark recognition processing, and the substrate positioning operation. Then, after the substrate positioning operation, the moving operation of the imaging unit 17 by the imaging unit moving mechanism 21 is corrected on the basis of the inter-optical-axis relative position data 43a and the surface correction data 43b to execute the mark imaging operation and the mark recognition processing. The substrate positioning precision in a state before starting the production is evaluated on the basis of the recognition result in the mark recognition processing (production pre-start precision evaluation processing process).

Figure 10:
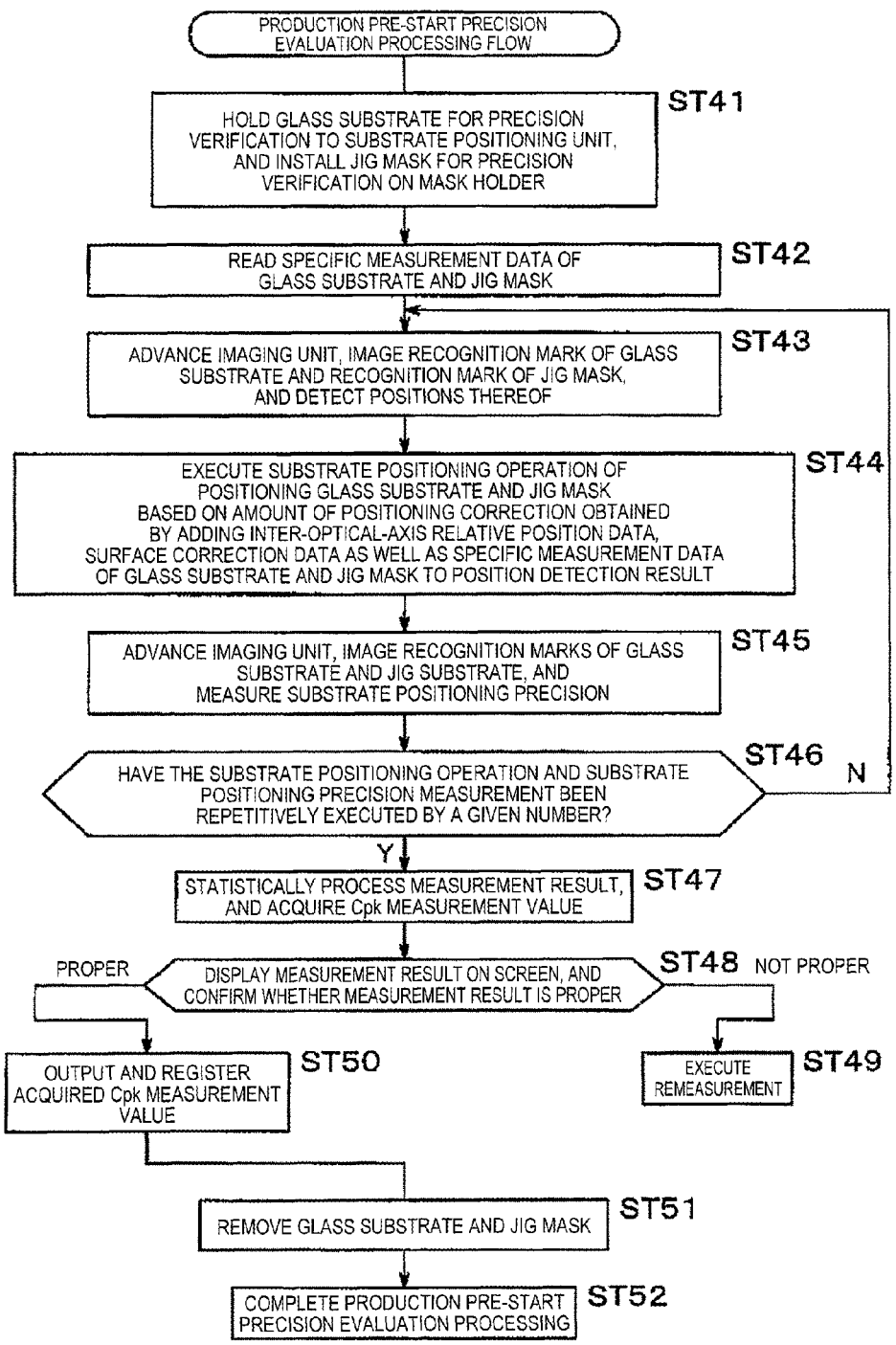
FIG. 10 is a flowchart illustrating production pre-start precision evaluation processing in the screen printing method according to the embodiment of the present invention.
Figure 13A:
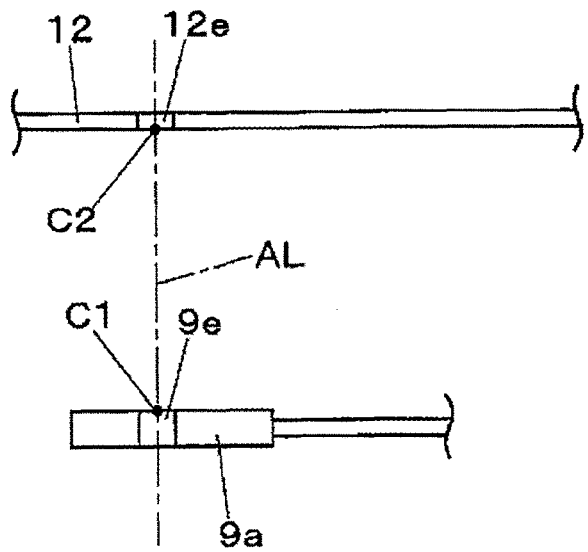
FIGS. 13(a) to 13(c) are illustrative views of processes of the optical axis calibration processing in the screen printing method according to the embodiment of the present invention.
Figure 13B:
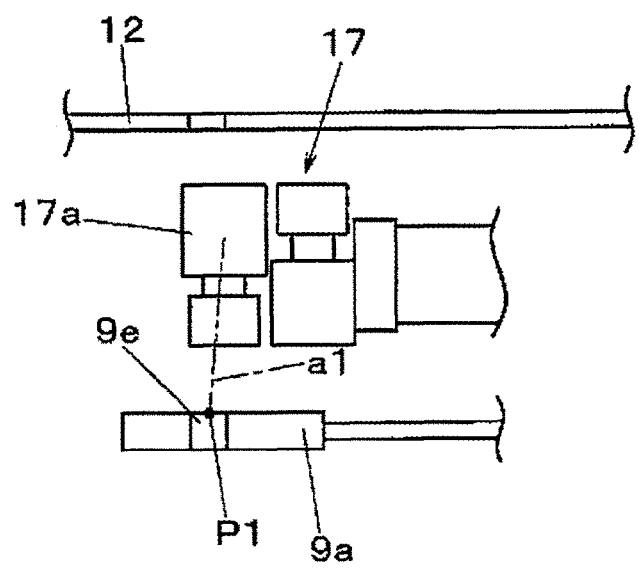
Figure 13C:
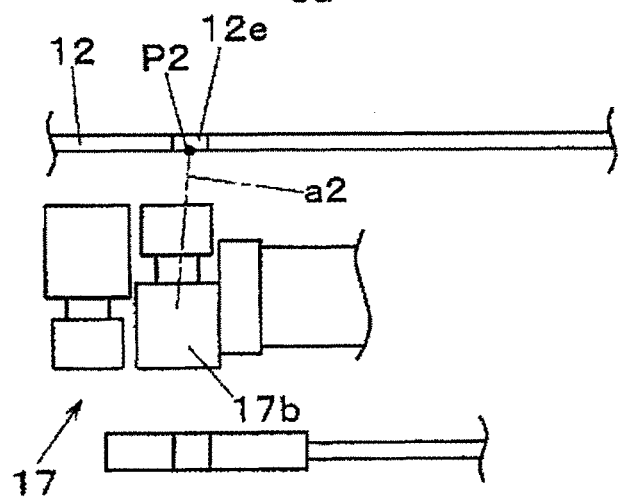

Referring to FIG. 10, the glass substrate 10B for precision verification is first held in the substrate positioning unit 1, and the jig mask 12B for precision verification is installed on the mask frame 12a (ST41). In this example, the glass substrate 10B and the jig mask 12B which are the same as those used for the surface correction data creation processing are used for the precision verification. The specific measurement data of the glass substrate 10B and the jig mask 12B, that is, the calibration data attached to the glass substrate 10B and the jig mask 12B is read (ST42).

Then, the imaging unit 17 is advanced to image the recognition marks 10m of the glass substrate 10B and the recognition marks 12m of the jig mask 12B, respectively, and detect the positions thereof (ST43). Then, the substrate positioning operation of positioning the glass substrate 10B and the jig mask 12B is executed on the basis of the amount of positioning correction obtained by adding the surface correction data 43b as well as the specific measurement data of the glass substrate 10B and the jig mask 12B to the position detection result (ST44). As a result, the substrate positioning is executed so that the positional deviations Δx and Δy, and the deviation angle α illustrated in FIG. 5(b) become as small as possible.

Thereafter, the measurement for evaluating the substrate positioning result in precision is conducted. That is, the imaging unit 17 is again advanced to image the recognition mark of the glass substrate 10B and the recognition mark of the jig mask 12B, and measure the substrate positioning precision (ST45). In this example, the substrate positioning operation and the substrate positioning precision measurement described above are repetitively executed by a predetermined number of times for the purpose of acquiring the Cpk value for confirming the device reliability.

That is, the operation processing of (ST43) to (ST45) is repetitively executed, and it is determined whether the substrate positioning operation and the substrate positioning precision measurement have been repetitively executed by the given number of times, or not, in (ST46). If it is determined that the execution has been completed in (ST46), the measurement result is subjected to the statistical processing to acquire the Cpk value (ST47). In this example, the Cpk value is a known index value generally known as a production management technique, and calculated for each of the positional deviations Δx, Δy, and the deviation angle α as the positioning precision data illustrated in FIG. 5(b). The Cpk value is defined by a value obtained by dividing preset standard widths of the respective data by 6σ (σ: standard deviation) obtained for the respective measurement data.

The measurement result of the acquired Cpk value is displayed on the screen, and it is confirmed whether the measurement result is proper, or not (ST48), and if the determination is no, remeasurement is executed (ST49). In this case, the operation processing subsequent to (ST43) is repetitively executed. Then, if the determination is yes in (ST48), the acquired Cpk value is output, and registered (ST50).

Thereafter, the glass substrate and the jig mask are removed (ST51), and the production pre-start precision evaluation processing is completed (ST52).

Subsequently, a description will be given of a detailed flow of the production post-start precision evaluation processing shown in (ST5) of FIG. 7 with reference to FIG. 11. The production post-start precision evaluation processing is executed for evaluating the positioning precision after starting the production in the above-described screen printing operation, in particular, the repetitive positioning precision when the same operation is repetitively executed on the same substrate.

In this example, the moving operation of the imaging unit 17 by the imaging unit moving mechanism 21 is corrected for the substrate 10 and the mask plate 12 for the commercial production on the basis of the inter-optical-axis relative position data 43a and the surface correction data 43b to execute the mark imaging operation, the mark recognition processing, and the substrate positioning operation. Then, after the substrate positioning operation, the moving operation of the imaging unit 17 by the imaging unit moving mechanism 21 is corrected on the basis of the inter-optical-axis relative position data 43a and the surface correction data 43b to execute the mark imaging operation and the mark recognition processing. The substrate positioning precision in a state before starting the production is evaluated on the basis of the recognition result in the mark recognition processing.

Referring to FIG. 11, the number of substrates to be evaluated in precision is set and input (ST61). The number of substrates is experimentally set according to the degree of quality reliability required for the substrates, individually. Then, the mask plate 12 for the commercial production is installed on the mask frame 12a (ST62). Then, print data for executing the screen printing for the subject is read (ST63). Then, the substrate 10 for the commercial production is carried in the device, and held by the substrate positioning unit 1 (ST64). Then, the imaging unit 17 is advanced to image the recognition marks 10m of the substrate 10 and the recognition marks 12m of the mask plate 12, and detect the positions thereof (ST65).

Then, the substrate positioning operation of positioning the substrate 10 and the mask plate 12 is executed on the basis of the amount of positioning correction obtained by adding the inter-optical-axis relative position data 43a and the surface correction data 43b to the position detection result (ST66). Thereafter, the measurement for evaluating the substrate positioning result in precision is conducted. That is, the imaging unit 17 is again advanced to image the recognition mark 10m of the substrate 10 and the recognition mark 12m of the mask plate 12, and measure the substrate positioning precision (ST67).

Thereafter, the screen printing operation is executed. That is, the substrate 10 is abutted against the lower surface of the mask plate 12, and the squeegee 16 is slid on the mask plate 12, to thereby execute the screen printing operation of printing the solder cream (ST68). Then, the plate releasing operation of releasing the substrate 10 from the lower surface of the mask plate 12 is executed (ST69). As a result, the screen printing operation for a single substrate 10 is completed.

Thereafter, the measurement for evaluating the substrate positioning result in precision after the substrate positioning operation has been executed is conducted. That is, the imaging unit 17 is again advanced to image the recognition mark 10m of the substrate 10 and the recognition mark 12m of the mask plate 12, and measure the substrate positioning precision (ST70). Then, the substrate 10 after the screen printing is carried downstream out of the substrate positioning unit 1 (ST71).

In this situation, it is determined whether the precision evaluation has been completed on the set number of substrates, or not (ST72). If the evaluation has not yet been completed, the flow returns to (ST64), a new substrate 10 is carried in, and the same operation processing is repetitively executed. Then, if the precision evaluation completion is confirmed in (ST72), the measurement result is subjected to the statistical processing to acquire the Cpk value, and display the precision evaluation result on the display unit 48 (ST73). The Cpk value obtained in this case is the same as that in the production pre-start precision evaluation processing. Then, it is determined whether the displayed evaluation result is good, or not, by the operator (ST74). If it is determined that the result is good, the production is continued as it is (ST75). Then, if the evaluation result is not good, the production is suspended (ST76), and a measure for correcting no-good is implemented.

That is, in the production post-start precision evaluation process, the mark imaging operation and the mark recognition processing are executed before and after the screen printing process for one substrate 10 to be evaluated. As a result, an influence of the execution of the screen printing operation on the substrate positioning precision can be evaluated empirically.

As described above, in the screen printing according to this embodiment, prior to the mark imaging process that is executed for detecting the positions of the recognition marks 10m and the recognition marks 12m in the positioning of the substrate 10 and the mask plate 12, there are executed the optical axis calibration processing process of detecting the horizontal relative positions of the imaging optical axes a1 and a2 of the substrate recognition camera 17a and the mask recognition camera 17b, and outputting the detected relative positions as the inter-optical-axis relative position data 43a, and the surface correction data creation processing process of detecting the local positional deviations of the imaging optical axes a1 and a2, which are caused by the move of the imaging unit 17 by the imaging unit moving mechanism 21, and outputting the positional deviations as the surface correction data 43b. Then, the production pre-start precision evaluation process is executed for evaluating the positioning precision in the substrate positioning operation with the use of the verification substrate and the verification mask before the production starts. Further, the production pre-start precision evaluation process that evaluates the substrate positioning precision in a state after the production starts is executed with the use of the substrate 10 and the mask plate 12 for the commercial production after the production starts.

As a result, in a configuration in which the imaging unit 17 having the two imaging optical axes a1 and a2, which is intended to image the substrate 10 and the mask plate 12, an error of the relative position between the imaging optical axes a1 and a2, and the position error locally caused by the drive error in the difference of the imaging unit 17 are properly corrected to improve the substrate positioning precision.

The present invention is based on Japanese Patent Application No. 2010-234324 filed on Oct. 19, 2010, and content thereof is incorporated herein by reference.

INDUSTRIAL APPLICABILITY

The screen printing device and the screen printing method according to the present invention has, in a configuration in which the imaging unit having the two imaging optical axes, which is intended to image the substrate and the mask plate, an error of the relative position between the imaging optical axes, and the position error caused by the move of the imaging unit are properly corrected to improve the substrate positioning precision. The present invention is useful in the field of the screen printing for printing the paste such as a solder cream or a conductive paste on the substrate.

DESCRIPTION OF REFERENCE SIGNS

1 Substrate Positioning Unit
7 Substrate Lower Receiving Unit
8 Substrate Transport Mechanism
9A Clamp Member
9B Recognition Hole
10 Substrate
10b Glass Substrate
10r Reference Point
10m Recognition Mark
11 Screen Printing Unit
12 Mask Plate
12A, 12B Jig Mask
12b Pattern Hole
12e Recognition Hole
12r Reference Point
12m Recognition Mark
13 Squeegee Head
16 Squeegee
17 Imaging Unit
17a Substrate Recognition Camera
17b Mask Recognition Camera
21 Imaging Unit Moving Mechanism
A1, A2 Imaging Optical Axis
D* Relative Distance

The invention claimed is:
1. A screen printing device that abuts a substrate against a mask plate in which pattern holes are formed to print a paste, the screen printing device comprising:

a substrate positioning unit that holds a substrate carried from an upstream side, and moves the substrate relatively in a horizontal direction and a vertical direction to position the substrate at a given position;

a screen print unit that allows a squeegee to slide on the mask plate onto which the paste is supplied, to print the paste on the substrate through the pattern holes;

an imaging unit that has two imaging optical axes of which imaging directions are upward and downward, respectively, and conducts mark imaging operation of imaging a substrate recognition mark and a mask recognition mark formed on the substrate and the mask plate, respectively;

an imaging unit moving mechanism that moves the imaging unit in the horizontal direction with respect to the substrate and the mask plate;

a recognition processing unit that subjects an imaging result in the mark imaging operation to recognition processing, thereby conducting mark recognition processing for detecting positions of the substrate recognition mark and the mask recognition mark;

an optical axis calibration processing unit that detects relative positions of the imaging optical axes on a mask lower surface and a substrate upper surface which are imaging surfaces of the two imaging optical axes, respectively, by imaging two reference marks associated with the relative positions by the imaging unit, individually, and outputs the detected relative positions as inter-optical-axis relative position data;

a surface correction data creation processing unit that obtains a position error of the imaging optical axis occurring on the imaging surfaces in the horizontal direction caused by the move of the imaging unit by the imaging unit moving mechanism, as a positional deviation in the horizontal direction which is specific to each of reference points set in an ordered array for a substrate area on which the substrate is held and a mask area on which a mask plate is installed, respectively, and outputs the obtained position error as surface correction data representing a local positional deviation state in each of surfaces of the substrate area and the mask area;

a substrate positioning control unit that controls the imaging unit, the imaging unit moving mechanism, and the recognition processing unit so as to execute the mark imaging operation and the mark recognition processing, and controls the substrate positioning unit on the basis of the inter-optical-axis relative position data, the surface correction data, and the result of the mark recognition processing to execute substrate positioning operation for positioning the substrate and the mask plate; and a precision evaluation unit that evaluates a positioning precision of the substrate positioning operation, wherein before starting production by the screen printing device, the precision evaluation unit corrects the moving operation of the imaging unit by the imaging unit moving mechanism on the basis of the inter-optical-axis relative position data and the surface correction data for a verification substrate and a verification mask each having a reference point set in an ordered array, which are produced in advance for verifying a positioning precision of the substrate and the mask plate to execute the mark imaging operation, the mark recognition processing, and the substrate positioning operation, wherein after the substrate positioning operation, the precision evaluation unit corrects the moving operation of the imaging unit by the imaging unit moving mechanism on the basis of the inter-optical-axis relative position data and the surface correction data to again execute the mark imaging operation and the mark recognition processing, and evaluates the positioning precision in a state before starting the production on the basis of the recognition result in the mark recognition processing, wherein after starting the production by the screen printing device, the precision evaluation unit further corrects the moving operation of the imaging unit by the imaging unit moving mechanism on the basis of the inter-optical-axis relative position data and the surface correction data for a commercial production substrate and a commercial production mask to execute the mark imaging operation, the mark recognition processing, and the substrate positioning operation, and wherein after the substrate positioning operation, the precision evaluation unit corrects the moving operation of the imaging unit by the imaging unit moving mechanism on the basis of the inter-optical-axis relative position data and the surface correction data to again execute the mark imaging operation and the mark recognition processing, and evaluates the positioning precision in a state after starting the production on the basis of the recognition result in the mark recognition processing.

2. The screen printing device according to claim 1, wherein the imaging unit is configured to arrange two imaging cameras having postures in which the imaging surfaces are oriented in opposite vertical directions, in parallel in a plan view.

3. A screen printing method in which a substrate is abutted against a mask plate having pattern holes formed therein to print a paste, the screen printing method comprising:

holding a substrate carried from an upstream side by a substrate positioning unit;

imaging a substrate recognition mark formed on the substrate, and a mask recognition mark formed on the mask plate installed in a screen printing unit by an imaging unit that has two imaging optical axes of which imaging directions are upward and downward, respectively, and is moved in a horizontal direction with respect to the substrate and the mask plate by the imaging unit moving mechanism;

recognizing an imaging result in the imaging of the marks by a recognition processing unit, thereby detecting positions of the substrate recognition mark and the mask recognition mark;

positioning the substrate to the mask plate by controlling the substrate positioning unit on the basis of the position detection results of the substrate recognition mark and the mask recognition mark; and printing a paste on the substrate through the pattern holes by sliding a squeegee on the mask plate having the pattern holes to which the paste is supplied, wherein, prior to the imaging of the marks, there are executed:

detecting horizontal relative positions of the respective imaging optical axes on a mask lower surface and a substrate upper surface which are imaging surfaces of the two imaging optical axes, respectively, by imaging two reference marks associated with the relative positions, individually, and outputting the detected relative positions as inter-optical-axis relative position data; and obtaining a position error of the imaging optical axis occurring on the imaging surface in the horizontal direction caused by the move of the imaging unit by the imaging unit moving mechanism, as a positional deviation in the horizontal direction for each of reference points set in an ordered array for a substrate area on which the substrate is held and a mask area on which a mask plate is installed, respectively, and outputting the obtained position error as surface correction data representing a local positional deviation state in each of surfaces of the substrate area and the mask area, wherein in a production pre-start precision evaluation executed to evaluate a positioning precision in the substrate positioning operation before starting the production, the moving operation of the imaging unit by the imaging unit moving mechanism is corrected on the basis of the inter-optical-axis relative position data and the surface correction data for a verification substrate and a verification mask each having a reference point set in an ordered array, which are produced in advance for verifying a positioning precision of the substrate and the mask plate to execute the mark imaging operation, the mark recognition processing, and the substrate positioning operation, wherein after the substrate positioning operation, the moving operation of the imaging unit by the imaging unit moving mechanism is corrected on the basis of the inter-optical-axis relative position data and the surface correction data to execute the mark imaging operation and the mark recognition processing, and the positioning precision in a state before starting the production is evaluated on the basis of the recognition result in the mark recognition processing, wherein in a production post-start precision evaluation that is executed for evaluating the positioning precision after starting the production, the moving operation of the imaging unit by the imaging unit moving mechanism is corrected on the basis of the inter-optical-axis relative position data and the surface correction data for a commercial production substrate and a commercial production mask to execute the mark imaging operation, the mark recognition processing, and the substrate positioning operation, and wherein after the substrate positioning operation, the moving operation of the imaging unit by the imaging unit moving mechanism is corrected on the basis of the inter-optical-axis relative position data and the surface correction data to execute the mark imaging operation and the mark recognition processing, and the substrate positioning precision in a state after starting the production is evaluated on the basis of the recognition result in the mark recognition processing.

4. The screen printing method according to claim 3, wherein in the production post-start precision evaluation, the mark imaging operation and the mark recognition processing are executed before and after the screen printing intended for one substrate.

* * * * *